United States Patent
Kondo et al.

(10) Patent No.: US 7,692,707 B2
(45) Date of Patent: Apr. 6, 2010

(54) SOLID-STATE IMAGE PICKUP APPARATUS, IMAGE PICKUP APPARATUS, AND IMAGE SENSOR

(75) Inventors: Yasushi Kondo, Kyoto-fu (JP);
Hiromasa Maruno, Kyoto-fu (JP)

(73) Assignee: Shimadzu Corporation, Kyoto (JP)

( * ) Notice: Subject to any disclaimer, the term of this patent is extended or adjusted under 35 U.S.C. 154(b) by 465 days.

(21) Appl. No.: 11/632,964

(22) PCT Filed: Jul. 20, 2005

(86) PCT No.: PCT/JP2005/013302

§ 371 (c)(1),
(2), (4) Date: Jan. 19, 2007

(87) PCT Pub. No.: WO2006/009164

PCT Pub. Date: Jan. 26, 2006

(65) Prior Publication Data

US 2008/0303933 A1 Dec. 11, 2008

(30) Foreign Application Priority Data

Jul. 20, 2004 (JP) .............................. 2004-211478
Aug. 20, 2004 (JP) .............................. 2004-240722

(51) Int. Cl.
*H04N 3/14* (2006.01)
*H04N 5/335* (2006.01)
*H04N 5/217* (2006.01)

(52) U.S. Cl. ...................... 348/311; 348/241; 348/315

(58) Field of Classification Search ...................... None
See application file for complete search history.

(56) References Cited

U.S. PATENT DOCUMENTS

2002/0093288 A1* 7/2002 Spencer et al. .............. 313/523

(Continued)

FOREIGN PATENT DOCUMENTS

JP 07-176721 7/1995

(Continued)

OTHER PUBLICATIONS

International Search Report dated Nov. 8, 2005 for PCT Application No. PCT/JP2005/013302.

(Continued)

*Primary Examiner*—Sinh Tran
*Assistant Examiner*—Wanda M Negron
(74) *Attorney, Agent, or Firm*—Cheng Law Group, PLLC

(57) ABSTRACT

In a solid-state image sensor according to this invention, an image signal temperature variation suppressing unit changes a voltage value of a driver voltage applied to multiplying registers in response to variations in sensor temperature of a CCD image sensor. Thus, a charge multiplication gain of a charge multiplying unit is electrically controlled to suppress variations in signal strength of image signals due to the variations in the sensor temperature of the CCD image sensor. As a result, without relying on thermal control with which it is very difficult to realize high precision control, variations in the signal strength of the image signals due to the variations in the sensor temperature of the CCD image sensor are suppressed easily by controlling the charge multiplication gain of the charge multiplying unit based on the electric control, with which it is very easy to realize high precision control, performed by the image signal temperature variation suppressing unit in response to the variations in the sensor temperature of the CCD image sensor.

9 Claims, 12 Drawing Sheets

U.S. PATENT DOCUMENTS

| | | | |
|---|---|---|---|
| 2002/0126213 A1* | 9/2002 | Hynecek | 348/241 |
| 2002/0191093 A1* | 12/2002 | Hynecek | 348/311 |
| 2003/0035057 A1* | 2/2003 | Hakamata et al. | 348/311 |
| 2003/0042400 A1* | 3/2003 | Hynecek | 250/208.1 |

FOREIGN PATENT DOCUMENTS

| | | |
|---|---|---|
| JP | 10-304256 | 11/1998 |
| JP | 2001-251556 | 9/2001 |
| JP | 2001-345441 | 12/2001 |
| JP | 2002-290836 | 10/2002 |
| JP | 2002-330352 | 11/2002 |
| JP | 2002330352 A * | 11/2002 |

OTHER PUBLICATIONS

J. Hynecek, "Impactron-A New Solid State Image Intensifier," IEEE Transactions on Electron Devices, vol. 48, No. 10, Oct. 2001, (p. 2238-2241, Fig. 1).

M.S. Robbin, et al., "The Noise Performance of Electron Multiplying Charge-Coupled Devices", IEEE Transactions on Electron Devices, vol. 50, No. 5, May 2003 (p. 1227-1232, Fig. 2-3).

* cited by examiner

SOLID-STATE IMAGE PICKUP APPARATUS, IMAGE PICKUP APPARATUS, AND IMAGE SENSOR

TECHNICAL FIELD

This invention relates to a solid-state image pickup apparatus, an image pickup apparatus, and an image sensor, having a plurality of photoelectric conversion devices arranged in a two-dimensional array on a plane of projection of an object image.

BACKGROUND ART

CCD image sensors which are solid-state image sensors widely used in image pickup apparatus have been used in electronic cameras and the like in recent years. A conventional CCD image sensor, as shown in FIG. 14, for example, includes numerous photoelectric converters 191 arranged in a two-dimensional array on a plane of projection of an object image serving as an image area, CCD cells 192 and 193, output registers 194 and a charge-to-voltage converter 195. Signal charges for one frame detected through photoelectric conversion by the photoelectric converters 191 are all transferred by the CCD cells 192 to the CCD cells 193 in adjacent storage areas to be once stored therein. Then, the signal charges are transferred, in units of a predetermined number, by the CCD cells 193 to the output registers 194 arranged in a charge fetching area. Subsequently, the output registers 194 transfer the charges again, successively, to the charge-to-voltage converter 195 for conversion into voltage signals which are outputted as image signals (see Patent Document 1, for example).

(i) In recent years, two proposals have been made with regard to the CCD image sensor, to improve detection sensitivity, i.e. to realize increased sensitivity, by suppressing increase of noise and multiplying signal charges. These two proposals have a point in common in that detection sensitivity is improved by providing a charge multiplier (not shown) that multiplies signal charges by means of an impact ionization phenomenon caused by the signal charges passing through a high electric field region.

To describe the first proposal more particularly, part of the CCD cells 193 in the storage area are made to generate a high electric field region for charge multiplication. When transferring the signal charges, the charges are passed through the high electric field region for charge multiplication to multiply the signal charges, thereby to attain high sensitivity. That is, the first proposal increases sensitivity by incorporating the charge multiplier into the CCD cells 193 in the storage area (see Patent Document 2 and Non-patent Document 1, for example).

To describe the other proposal more particularly, a multiplying register is provided between the output registers 194 and charge-to-voltage converter 195 for generating a high electric field region for charge multiplication. When transferring signal charges, the charges are passed through the high electric field region for charge multiplication to multiply the signal charges, thereby to attain high sensitivity. That is, the latter proposal increases sensitivity by additionally providing a charge multiplier between the output registers 194 and charge-to-voltage converter 195 (see Patent Document 1 and Non-patent Document 2, for example).

(ii) In the case of the CCD image sensor in FIG. 14, as noted in (i), a charge multiplier (not shown) is additionally provided between the output registers 194 and charge-to-voltage converter 195. Since the signal charges outputted from the output registers 194 are converted into voltage signals after being multiplied by the charge multiplier, detection sensitivity is high for an optical image of an object. However, the speed of fetching the signal charges is not fast enough for high-speed photography exceeding 10,000 pictures per second (=10,000 frames per second).

On the other hand, high-speed image sensors capable of high-speed photography exceeding 10,000 pictures per second have already been developed. In conventional high-speed image sensors, as shown in FIGS. 15 (a) and 15 (b), each photoelectric converter 201 has a signal charge storage unit 202 for receiving, picture by picture, signal charges detected through photoelectric conversion by the photoelectric converter 201 and corresponding to a plurality of pictures, and storing the charges separately for the respective pictures. FIG. 15 (a) and FIG. 15 (b) show only part of photoelectric converters 201 arranged vertically. In reality, numerous photoelectric converters 201 are arranged both vertically and horizontally.

Each signal charge storage unit 202 includes a plurality of CCD cells 202A connected in series. As each frame is acquired during a photographic operation, a signal charge is fed from each photoelectric converter 201 to the first CCD cell 202A, and signal charges already stored at preceding acquisition steps are simultaneously passed forward by one CCD cell 202A. Thus, the CCD cells 202A of each signal charge storage unit 202 have signal charges for respective frames and corresponding in number to the CCD cells 202A, stored in the order of acquisition. The signal charges stored in the CCD cells 202A of each signal charge storage unit 202 are read after the photographic operation, converted into voltage signals, and then outputted as video signals (see Patent Document 3, for example).

Thus, in the case of the high-speed image sensors of FIG. 15 (a) and FIG. 15 (b), the photoelectric converter 201 has, attached thereto, the signal charge storage unit 202, in which the signal charges fed from the photoelectric converter 201 are transferred between the CCD cells 202A in an extremely short time, to be stored for the number of frames corresponding to the number of CCD cells 202A. Each signal charge storage unit 202 accumulates, as a lot, the signal charges for the same number of frames as the number of CCD cells 202A. It is therefore usable in high-speed photography exceeding 10,000 frames per second.

In the case of the high-speed image sensor of FIG. 15 (a), the two-dimensional array arrangement of photoelectric converters 201 does not become a square matrix. This is because, among the photoelectric converters 201 arranged vertically, lower photoelectric converters 201 are arranged obliquely leftward below upper photoelectric converters 201 so as not to overlap upper signal charge storage units 202. On the other hand, in the case of the high-speed image sensor of FIG. 15 (b), the CCD cells 202A of the signal charge storage units 202 are arranged obliquely, and lower photoelectric converters 201 are arranged directly under upper photoelectric converters 201. Consequently, the two-dimensional array arrangement of photoelectric converters 201 forms a square matrix.

[Patent Document 1]

Japanese Unexamined Patent Publication H10-304256

[Patent Document 2]

Japanese Unexamined Patent Publication H7-176721 (pages 3-7, FIGS. 1-11)

[Patent Document 3]

Japanese Unexamined Patent Publication No. 2001-345441 (page 2, FIGS. 11 and 12)

[Non-patent Document 1]

J. Hynecek, "Impactron-A New Solid State Image Intensifier, "IEEE Trans. on Elec. Dev., vol. 48, No. 10, 2001 (p. 2238-2241, FIG. 1)

[Non-patent Document 2]

M. S. Rpbbins, B. J. Hadwen, "The Noise Performance of Electron Multiplying Charge-Coupled Devices, "IEEE Trans. on Elec. Dev., vol. 50, No. 5, 2003 (p. 1227-1229, FIG. 2-3)

DISCLOSURE OF THE INVENTION

Problems to be Solved by the Invention

However, there are the following problems (i) and (ii):

Regarding Problem (i)

The above conventional CCD image sensor has a problem that it is not easy to suppress variations in signal strength of image signals occurring with variations in sensor temperature.

That is, in the case of the above conventional CCD image sensor, the electric charge multiplication gain of the charge multiplier provided to multiply signal charges varies with the sensor temperature of the solid-state image sensor (see FIG. 2 (b) on p. 2240 of Non-patent Document 1 or FIG. 4 on p. 1228 of Non-patent Document 2). Therefore, if the sensor temperature of the solid-state image sensor is left as it is, the signal strength of the image signals will vary due to variations in the sensor temperature of the solid-state image sensor. The variations in the signal strength of the image signals are detrimental to the reproducibility of an image obtained, and the reproducibility of a profile.

Therefore, when using the above conventional CCD image sensor, temperature control is carried out to keep constant the sensor temperature of the solid-state image sensor, thereby to suppress variations per se of the sensor temperature of the solid-state image sensor. That is, in the case of the above conventional CCD image sensor, the electric charge multiplication gain of the charge multiplier is thermally controlled for stability.

However, the sensor temperature of the solid-state image sensor is readily changeable with environmental temperature, and the time constant of the temperature change is long because of the nature of heat. It is therefore difficult, in practice, to realize stabilization of the electric charge multiplication gain of the charge multiplier by the thermal control for keeping constant the sensor temperature of the solid-state image sensor.

Regarding Problem (ii)

The above conventional high-speed image sensor has a problem that the light-receiving surfaces of photoelectric converters 201 which carry out photoelectric conversion of optical images of an object have a large area. In the case of high-speed photography exceeding 10,000 frames per second, the time when optical images of an object are projected to the light-receiving surfaces of photoelectric converters 201 is very short, and the quantity of light incident on the light-receiving surfaces of photoelectric converters 201 is small. Therefore, the area of the light-receiving surfaces of photoelectric converters 201 must be made large to enhance detection sensitivity. As a result, the area of the light-receiving surfaces of photoelectric converters 201 becomes large.

Where, as noted above, the area of the light-receiving surfaces of photoelectric converters 201 is large, not only is it difficult to arrange the photoelectric converters 201 in high density, but it is also difficult to take signal charges out of the photoelectric converters 201. As shown in FIG. 16, where transfer electrodes 203A and 203B are arranged on the light-receiving surfaces of photoelectric converters 201, signal charges can be taken out quickly. That is, they can be transferred to the signal charge storage units 202. However, there arise different inconveniences that a process is required for additionally forming the transfer electrodes 203A and 203B and, moreover, detection sensitivity lowers for light of particular wavelengths due to the light-absorbing action of the transfer electrodes 203A and 203B.

This invention has been made having regard to the state of the art noted above, and its object is to provide a solid-state image pickup apparatus, an image pickup apparatus and an image sensor (i) capable of suppressing easily variations in signal strength of image signals occurring with variations in the sensor temperature of the solid-state image sensor, and (ii) capable of reducing the area of the light-receiving surfaces of photoelectric conversion devices that carry out photoelectric conversion of optical images of an object.

Means for Solving the Problem

A solid-state image pickup apparatus according to this invention made in order to solve the problem (i) noted above, is a solid-state image pickup apparatus for picking up images, comprising a solid-state image sensor, a charge multiplying device and an image signal temperature variation suppressing device, the solid-state image sensor including a plurality of photoelectric conversion devices arranged in a two-dimensional array on a plane of projection of an object image, a charge transfer device for transferring signal charges detected through photoelectric conversion by the respective photoelectric conversion devices, and a charge-to-voltage conversion device for converting the signal charges transferred from the charge transfer device into voltage signals for output as image signals, characterized in that the charge multiplying device multiplies the signal charges based on an impact ionization phenomenon caused by the signal charges passing through high electric field regions, the charge multiplying device being disposed upstream of the charge-to-voltage conversion device, and the imaging signal temperature variation suppressing device electrically controls charge multiplication gain of the charge multiplying device in response to variations in the sensor temperature of the solid-state image sensor, to suppress variations in signal strength of the image signals due to the variations in the sensor temperature of the solid-state image sensor, or electrically adjusts the signal strength of the image signals per se in response to variations in the sensor temperature of the solid-state image sensor, to suppress the variations in signal strength of the image signals due to the variations in the sensor temperature of the solid-state image sensor.

With the solid-state image pickup apparatus according to this invention, when a photographic operation is performed using this solid-state image pickup apparatus, an object image is converted into signal charges through photoelectric detection by the plurality of photoelectric conversion devices arranged in a two-dimensional array on the plane of projection of the object image. Then, the charges are transferred to the charge-to-voltage conversion device by the charge transfer device. The signal charges are multiplied by the charge multiplying device disposed upstream of the charge-to-voltage conversion device. Subsequently, the charge-to-voltage conversion device converts the charges into voltage signals as image signals to be outputted. The charge multiplying device disposed upstream of the charge-to-voltage conversion device multiplies the signal charges based on an impact ionization phenomenon caused by the signal charges passing through the high electric field regions. Thus, the object image converted into signal charges by the plurality of photoelectric conversion devices arranged in a two-dimensional array are converted into voltage signals as image signals, after being amplified with an increase of noise suppressed by the multiplying function of the charge multiplying device. As a result, detection sensitivity for the object image is improved.

Further, where the imaging signal temperature variation suppressing device electrically controls the charge multiplication gain of the charge multiplying device in response to variations in the sensor temperature of the solid-state image sensor to suppress variations in the signal strength of the imaging signals due to the variations of the sensor temperature of the solid-state image sensor, the result is as follows. Without relying on thermal control with which it is very difficult to realize high precision control, variations in the signal strength of the image signals due to the variations in the sensor temperature of the solid-state image sensor are suppressed by controlling the charge multiplication gain of the charge multiplying device based on the electric control, with which it is very easy to realize high precision control, performed by the image signal temperature variation suppressing device in response to the variations in the sensor temperature of the solid-state image sensor.

Further, where the imaging signal temperature variation suppressing device electrically adjusts the signal strength of the image signals per se in response to variations in the sensor temperature of the solid-state image sensor to suppress variations in the signal strength of the imaging signals due to the variations of the sensor temperature of the solid-state image sensor, the result is as follows. Without relying on thermal control with which it is very difficult to realize high precision control, variations in the signal strength of the image signals due to the variations in the sensor temperature of the solid-state image sensor are suppressed by controlling the signal strength of the imaging signals based on the electric adjustment, with which it is very easy to realize high precision control, performed by the image signal temperature variation suppressing device in response to the variations in the sensor temperature of the solid-state image sensor.

In one example of this invention made in order to solve the problem (i) noted above, the charge multiplying device includes a plurality of multiplying registers for successively transferring the signal charges, each multiplying register generating a high electric field region for charge multiplication in an element of the multiplying register in response to a driver voltage applied thereto, and multiplying the signal charges by passing the charges through the high electric field regions for charge multiplication when transferring the signal charges, the high electric field regions for charge multiplication having a field strength changeable with changing of a voltage value of the driver voltage applied, the charge multiplication gain of the charge multiplying device being electrically controlled by changing the voltage value of the driver voltage in response to variations in the sensor temperature of the solid-state image sensor.

In this example of the invention, the imaging signal temperature variation suppressing device changes the voltage value of the driver voltage applied to the multiplying registers in response to variations in the sensor to control electrically the charge multiplication gain of the charge multiplying device. Thus, the control of the charge multiplication gain of the charge multiplying device is carried out very easily based on the electric control by the imaging signal temperature variation suppressing device.

In one example of this invention made in order to solve the problem (i) noted above, the solid-state image sensor and the charge multiplying device are arranged separately.

In this example of the invention, since the charge multiplying device is arranged separately, the charge multiplying device may be arranged without changing the constructions of the other portions.

In one example of this invention made in order to solve the problem (i) noted above, the solid-state image sensor has a temperature sensor for detecting a sensor temperature of the solid-state image sensor, the imaging signal temperature variation suppressing device being operable in response to the sensor temperature of the solid-state image sensor detected by the temperature sensor.

In this example of the invention, the sensor temperature of the solid-state image sensor is detected properly by the temperature sensor attached to the solid-state image sensor itself. Thus, variations in the signal strength of the image signals due to the variations in the sensor temperature of the solid-state image sensor are suppressed properly.

In one example of this invention having the above temperature sensor, the temperature sensor is disposed adjacent the charge multiplying device.

In this example of the invention, the temperature adjacent the charge multiplying device is fully reflected in the sensor temperature of the solid-state image sensor detected by the temperature sensor. Consequently, variations in the signal strength of the image signals accompanying temperature changes adjacent the charge multiplying device are fully suppressed.

One example of the above temperature sensor is a thermistor. Another example of the temperature sensor is a temperature detector using metal thin wires.

In one example of this invention made in order to solve the problem (i) noted above, the image signal temperature variation suppressing device has a resistance control type resistance element as a feedback resister with a variable resistance, the resistance of the resistance control type resistance element being varied based on a result of the sensor temperature of the solid-state image sensor, to adjust an amplification factor of an amplifying function of the image signal temperature variation suppressing device to vary electrically the signal strength of the imaging signals per se, thereby to suppress variations in signal strength of the image signals due to the variations in the sensor temperature of the solid-state image sensor.

In one example of this invention made in order to solve the problem (i) noted above, each of the photoelectric conversion devices has a plurality of signal charge storage devices for storing the signal charges detected through photoelectric conversion by the photoelectric conversion device.

In this example of the invention, the signal charges detected through photoelectric conversion by the photoelectric conversion devices are transferred to and stored in the signal charge storage devices attached to the photoelectric conversion devices. This construction is applicable also to a solid-state image sensor for high-speed imaging.

An image pickup apparatus according to this invention made in order to solve the problem (i) noted above, is an image pickup apparatus having the solid-state image pickup apparatus according to this invention made in order to solve the problem (i) noted above.

This image pickup apparatus according to the invention, with the solid-state image pickup apparatus according to this invention made in order to solve the problem (i) noted above, can easily suppress variations in the signal strength of the imaging signals due to the variations of the sensor temperature of the solid-state image sensor.

An image sensor according to this invention made in order to solve the problem (ii) noted above comprises a plurality of photoelectric conversion devices arranged in a two-dimensional array on a plane of projection of an object image, a plurality of signal charge storage devices attached to each photoelectric conversion device for taking in, frame by frame, signal charges for a plurality of frames detected through photoelectric conversion by each photoelectric conversion device, and storing the charges separately for the frames acquired, a signal charge readout device for transferring and reading the signal charges stored in the signal charge storage devices while maintaining a matching with the frames acquired, and a charge multiplying device for multiplying the signal charges read by the signal charge readout device, based on an impact ionization phenomenon caused by the signal charges passing through high electric field regions.

With the image sensor according to this invention, when a photographic operation is performed using this image sensor, during the photographic operation, the plurality of photoelectric conversion devices arranged in a two-dimensional array on the plane of projection of optical images of the object convert the optical images of the object appearing on the plane of projection into charge signals, take the charges in frame by frame, and feed them continuously into the signal charge storage devices attached to each photoelectric conversion device. The signal charge storage devices successively take in the signal charges a plurality of times, frame by frame, from the photoelectric conversion devices, and store the signal charges for a plurality of frames, separately for the frames taken in. After the photographic operation, the signal charges accumulated in the respective signal charge storage devices are transferred and read by the signal charge readout device while a matching with the taken-in frames is maintained. Further, the signal charges read are multiplied by the charge multiplying device which carries out multiplication in response to an impact ionization phenomenon caused by the signal charges passing through high electric field regions.

In the case of the image sensor according to this invention, each photoelectric conversion device has signal charge storage devices attached thereto for successively taking in, frame by frame, and storing for a plurality of frames, signal charges corresponding to photographic frames of optical images of the object fed from the photoelectric conversion device which detects the optical images of the object through photoelectric conversion. Thus, signal charges corresponding to photographic frames of the optical images of the object can be detected and stored at high speed in amounts corresponding to a plurality of photographic frames. The signal charge readout device transfers and reads the signal charges from the signal charge storage devices as matched with the frames, whereby a high-speed photographic image for each frame can be reproduced from the signal charges read.

Further, in the case of the image sensor according to this invention, after the signal charges corresponding to the photographic frames of optical images of the object are read by the signal charge readout device, the charge multiplying device multiplies the signal charges, without an increase of noise, based on an impact ionization phenomenon caused by the signal charges passing through high electric field regions. Thus, the area of the light-receiving surfaces of the photoelectric conversion devices can be diminished by an amount corresponding to the multiplication of the signal charges by the charge multiplying device. The reduction in the area of the light-receiving surfaces of the photoelectric conversion devices diminishes the photoelectric conversion devices to realize high density of the photoelectric conversion devices. Since the signal charges can be fetched quickly, photographing speed can also be accelerated.

In one example of this invention made in order to solve the problem (ii) noted above, the charge multiplying device includes a plurality of multiplying registers for successively transferring the signal charges, each multiplying register generating a high electric field region for charge multiplication in an element of the multiplying register in response to a driver voltage applied thereto, and multiplying the signal charges by passing the charges through the high electric field regions for charge multiplication when transferring the signal charges.

In this example of the invention, since the charge multiplying device includes a plurality of multiplying registers for successively transferring the signal charges, the signal charges are multiplied with a multiplication factor that is a total of multiplication factors of the respective multiplying registers.

In one example of this invention made in order to solve the problem (ii) noted above, the photoelectric conversion devices are an electrodeless type having, on light-receiving surfaces thereof, no transfer electrodes for transferring the signal charges having undergone the photoelectric conversion to the signal charge storage devices.

In this example of the invention, since the photoelectric conversion devices are the electrodeless type, there is no need for a step of additionally forming transfer electrodes on the light-receiving surfaces of the photoelectric conversion devices. It is possible to prevent a lowering of detection sensitivity for light of particular wavelength due to optical absorption action of the transfer electrodes.

In one example of this invention made in order to solve the problem (ii) noted above, a charge-to-voltage conversion device is disposed downstream of the charge multiplying device for converting the signal charges transferred from the charge multiplying device into voltage signals.

In this example of the invention, the charge-to-voltage conversion device converts the signal charges corresponding to the photographic frames of optical images of the object. Thus, the signal charges corresponding to the photographic frames of optical images of the object are outputted as voltage signals.

In one example of this invention made in order to solve the problem (ii) noted above, each of the photoelectric conversion devices has a micro lens mounted in front thereof for condensing light to be detected.

In this example of the invention, the micro lenses arranged on the front of the photoelectric conversion devices condense the light to be detected on the light-receiving surfaces of the photoelectric conversion devices. The micro lenses increase the quantity of light incident on the light-receiving surfaces of the photoelectric conversion devices, thereby correspondingly improving detection sensitivity for the optical image of the object.

In one example of this invention made in order to solve the problem (ii) noted above, the two-dimensional array in which the photoelectric conversion devices are arranged is a square matrix, the signal charge storage devices are a one-dimensional CCD cell array with a plurality of CCD cells connected in series, in which the signal charges are transferred to immediately downstream CCD cells each time a frame is taken in, and the CCD cells in the one-dimensional CCD cell array are arranged in a direction oblique to a direction of arrangement of the photoelectric conversion devices.

In this example of the invention, the two-dimensional array arrangement of the photoelectric conversion devices is a square matrix, and therefore the image sensor has detecting pixels also in a two-dimensional arrangement of square matrix, arranged regularly in straight rows and columns. Since the signal charge storage devices are a one-dimensional CCD cell array, the signal charge storage devices have a simple construction. Further, the CCD cells in the one-dimensional CCD cell array forming the signal charge storage devices are arranged in a direction oblique to the direction of arrangement of the photoelectric conversion devices. An increase in the number of CCD cells to enlarge the length of the one-dimensional CCD cell array will not run against the photoelectric conversion devices vertically and horizontally close thereto. Thus, it is possible to increase the number of CCD cells in the one-dimensional CCD cell array as the signal charge storage devices, thereby to increase the number of signal charges storable in the signal charge storage devices and to increase the number of images to be photographed continuously.

EFFECTS OF THE INVENTION

In the solid-state image pickup apparatus according to this invention, the charge multiplying device disposed upstream of the charge-to-voltage conversion device which converts an object image having been converted into signal charges by the photoelectric conversion devices arranged in a two-dimensional array, multiplies the signal charges based on an impact ionization phenomenon caused by the signal charges passing through high electric field regions. The object image converted into the signal charges by the photoelectric conversion devices are amplified, with an increase of noise suppressed, by the multiplying function of the charge multiplying device. Thus, detection sensitivity for the object image is improved.

Further, where the imaging signal temperature variation suppressing device electrically controls the charge multiplication gain of the charge multiplying device in response to variations in the sensor temperature of the solid-state image sensor to suppress variations in the signal strength of the imaging signals due to the variations of the sensor temperature of the solid-state image sensor, without relying on thermal control with which it is very difficult to realize high precision control, variations in the signal strength of the image signals due to the variations in the sensor temperature of the solid-state image sensor are suppressed by controlling the charge multiplication gain of the charge multiplying device based on the electric control, with which it is very easy to realize high precision control, performed by the image signal temperature variation suppressing device in response to the variations in the sensor temperature of the solid-state image sensor.

Further, where the imaging signal temperature variation suppressing device electrically adjusts the signal strength of the image signals per se in response to variations in the sensor temperature of the solid-state image sensor to suppress variations in the signal strength of the imaging signals due to the variations of the sensor temperature of the solid-state image sensor, without relying on thermal control with which it is very difficult to realize high precision control, variations in the signal strength of the image signals due to the variations in the sensor temperature of the solid-state image sensor are suppressed by controlling the signal strength of the imaging signals based on the electric adjustment, with which it is very easy to realize high precision control, performed by the image signal temperature variation suppressing device in response to the variations in the sensor temperature of the solid-state image sensor.

With the solid-state image pickup apparatus according to this invention, therefore, it is possible to suppress easily variations in the signal strength of the image signals due to the variations in the sensor temperature of the solid-state image sensor.

In the case of the image sensor according to this invention, each photoelectric conversion device has signal charge storage devices attached thereto for successively taking in, frame by frame, and storing for a plurality of frames, signal charges corresponding to photographic frames of optical images of the object fed from the photoelectric conversion device which detects the optical images of the object through photoelectric conversion. Thus, signal charges corresponding to photographic frames of the optical images of the object can be detected and stored at high speed in amounts corresponding to a plurality of photographic frames. The signal charge readout device transfers and reads the signal charges from the signal charge storage devices as matched with the frames, whereby a high-speed photographic image for each frame can be reproduced from the signal charges read.

Further, in the case of the image sensor according to this invention, after the signal charges corresponding to the photographic frames of optical images of the object are read by the signal charge readout device, the charge multiplying device multiplies the signal charges, without an increase of noise, based on an impact ionization phenomenon caused by the signal charges passing through high electric field regions. Thus, the area of the light-receiving surfaces of the photoelectric conversion devices can be diminished by an amount corresponding to the multiplication of the signal charges by the charge multiplying device.

With the image sensor according to this invention, therefore, it is possible to diminish the area of the light-receiving surfaces of the photoelectric conversion devices which performs photoelectric conversion of optical images of an object. The reduction in the area of the light-receiving surfaces of the photoelectric conversion devices diminishes the photoelectric conversion devices to realize high density of the photoelectric conversion devices. Since the signal charges can be fetched quickly, photographing speed can also be accelerated.

Figure 1:
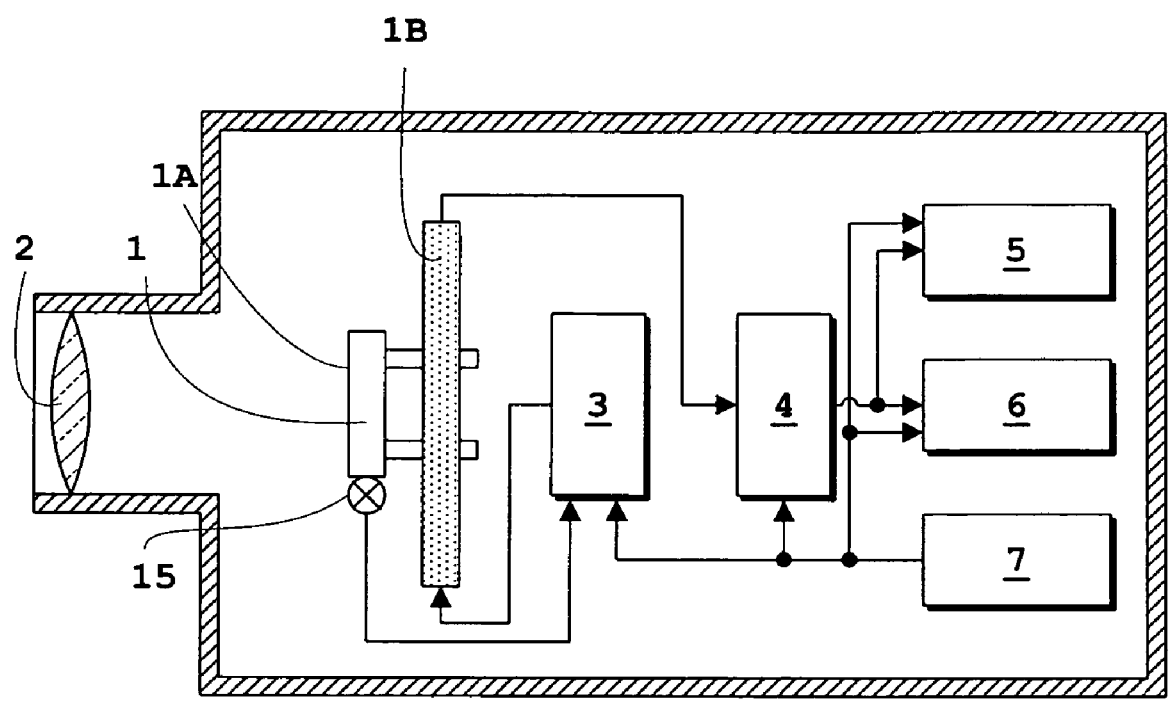
[FIG. 1]
Block diagram showing a principal portion of an image pickup apparatus in Embodiment 1.

DESCRIPTION OF REFERENCES 1, 16 . . . CCD image sensors
1A . . . plane of projection (of object images)
8 . . . photoelectric converters
9 . . . CCD cells
10 . . . CCD cells
11 . . . output registers
12 . . . charge-to-voltage converter
13 . . . charge multiplier
13A . . . multiplying registers
14, 17 . . . image signal temperature variation suppressing unit
15 . . . temperature sensor
φ3 . . . driver voltage

BEST MODE FOR CARRYING OUT THE INVENTION

The object of suppressing easily variations in signal strength of image signals occurring with variations in the sensor temperature of a solid-state image sensor has been fulfilled by providing an image signal temperature variation suppressing device that electrically controls electric charge multiplication gain of a charge multiplying device in response to variations in the sensor temperature of the solid-state image sensor, to suppress variations in signal strength of image signals due to the variations in the sensor temperature of the solid-state image sensor, or electrically adjusts the signal strength of the image signals per se in response to variations in the sensor temperature of the solid-state image sensor, to suppress the variations in signal strength of the image signals due to the variations in the sensor temperature of the solid-state image sensor.

Embodiment 1

Figure 2:
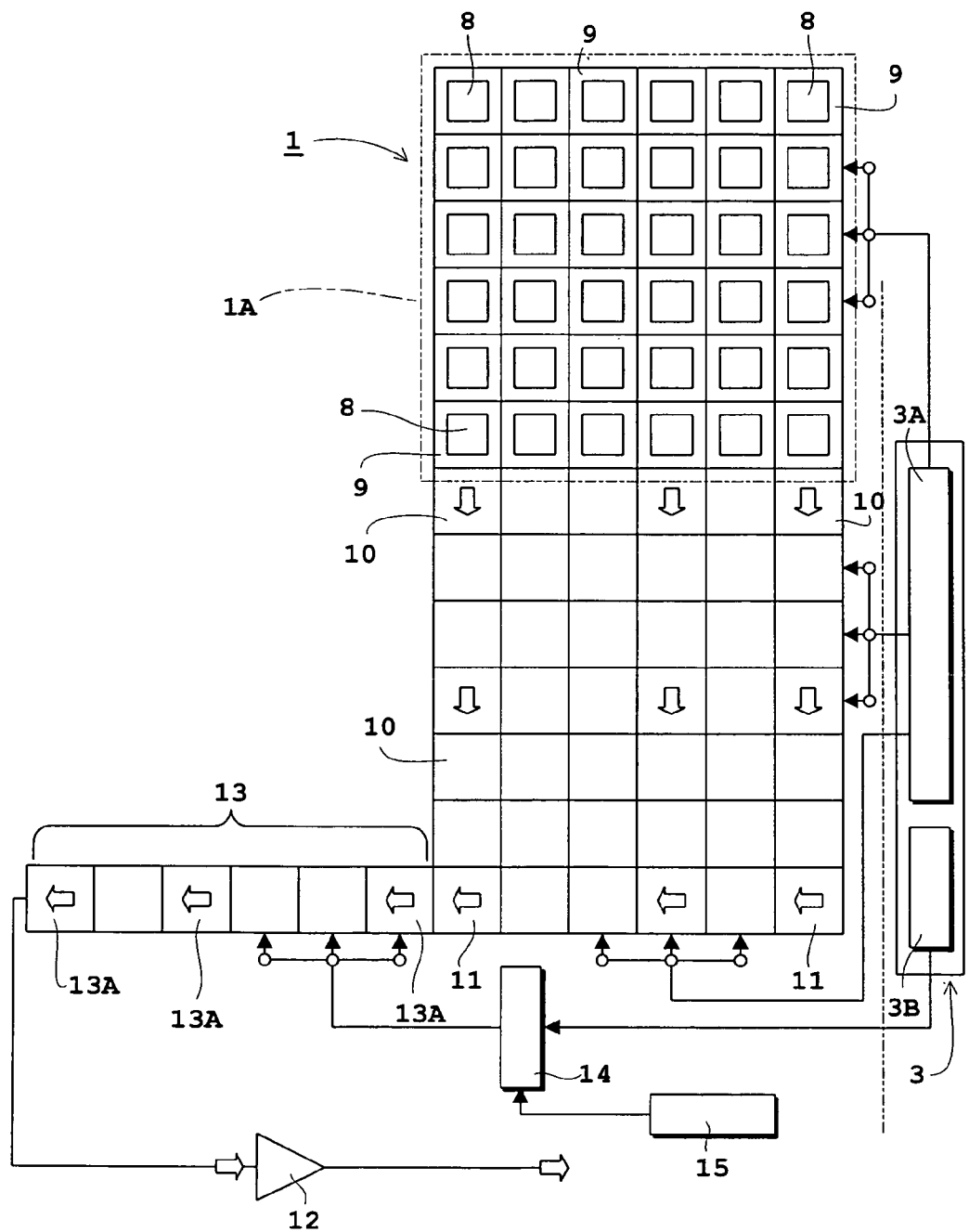
[FIG. 2]
Detailed block diagram chiefly showing a construction of a solid-state image pickup apparatus included in the image pickup apparatus in Embodiment 1.

An image pickup apparatus in Embodiment 1 having, incorporated therein, an example of solid state image pickup device according to this invention will be described with reference to the drawings. FIG. 1 is a block diagram showing a principal portion of an image pickup apparatus in Embodiment 1. FIG. 2 is a block diagram chiefly showing a construction of a solid-state image pickup device included in the image pickup apparatus in Embodiment 1.

The image pickup apparatus in Embodiment 1, as shown in FIG. 1, includes a CCD image sensor 1 for detecting object images, an optical lens 2 for forming the object images on a plane of projection 1A of the object images of the CCD image sensor 1, an image sensor driver 3 for driving the CCD image sensor 1, an image signal processor 4 for processing image signals outputted from the CCD image sensor 1 to acquire photo images, an image memory 5 for storing the photo image acquired by the image signal processor 4, an image display 6 for displaying the photo images acquired by the image signal processor 4, and a power source 7 for supplying electric power required for operation of the image pickup apparatus. The CCD image sensor 1 corresponds to the solid-state image sensor in this invention.

When a photographic operation is performed by the image pickup apparatus in Embodiment 1, an object image acquired through the optical lens 2 is projected to the plane of projection 1A of CCD image sensor 1. The CCD image sensor 1, driven by the image sensor driver 3, detects the object image, converts the image into image signals, and then outputs the signals to the image signal processor 4. The image signal processor 4 processes the image signals outputted from the CCD image sensor 1 to acquire a photo image. The photo image acquired by the image signal processor 4 is stored in the image memory 5, and displayed on the image display 6.

The image pickup apparatus in Embodiment 1 further includes a control unit (not shown) for setting photographic conditions, shuttering and so on. The CCD image sensor 1 is installed by soldering the CCD image sensor 1 to a wiring board 1B.

The CCD image sensor 1, as shown in FIG. 2, includes numerous photoelectric converters 8 arranged in a two-dimensional array of square matrix on the plane of projection 1A of the object image, CCD cells 9 arranged in a two-dimensional array similar to the photoelectric converters 8, for transferring signal charges detected through photoelectric conversion by the respective photoelectric converters 8 to a downstream storage region, CCD cells 10 for temporarily storing and retransferring the signal charges received from the CCD cells 9, CCD type output registers 11 for outputting, a predetermined number at a time, the signal charges stored in the CCD cells 10, and a charge-to-voltage converter 12 for converting the signal charges transferred from the CCD cells 9 via the output registers 11 into voltage signals for output as image signals. The photoelectric converters 8 correspond to the photoelectric conversion device in this invention. The CCD cells 9 and 10 and output registers 11 correspond to the charge transfer device in this invention. The charge-to-voltage converter 12 corresponds to the charge-to-voltage conversion device in this invention.

With the CCD image sensor 1 during an execution of photography, a driver voltage is outputted from a readout charge multiplication voltage applying mechanism 3A of the image sensor driver 3 to the CCD image sensor 1 in synchronism with shuttering operation. Signal electric charges for one object image detected through photoelectric conversion the photoelectric converters 8 in time of a first shuttering are transferred from the CCD cells 9 to the CCD cells 10 in time of a next shuttering, to be temporarily held therein. In time of a subsequent shuttering, the charges are fed through the output registers 11 to the charge-to-voltage converter 12 to be converted into image signals.

Further, the CCD image sensor 1, as shown in FIG. 2, includes a charge multiplying unit 13 for multiplying the signal charges based on an impact ionization phenomenon caused by the signal charges passing through high electric field regions. The charge multiplying unit 13 consists of a plurality of multiplying registers 13A interposed between the output registers 11 and charge-to-voltage converter 12 for successively transferring the signal charges. These multiplying registers 13A generate high electric field regions for charge multiplication in elements of the multiplying registers 13A in response to the driver voltage applied thereto, and multiply the signal charges by passing the charges through the high electric field regions for charge multiplication when transferring the signal charges. Although FIG. 2 shows the multiplying registers 13A only in six stages for expediency, the charge multiplying unit 13 usually has a multistage construction including tens to hundreds of multiplying registers 13A connected in series. The signal charges are increased 1000 times, for example, by the charge multiplying unit 13. The charge multiplying unit 13 corresponds to the charge multiplying device in this invention.

Figure 3:
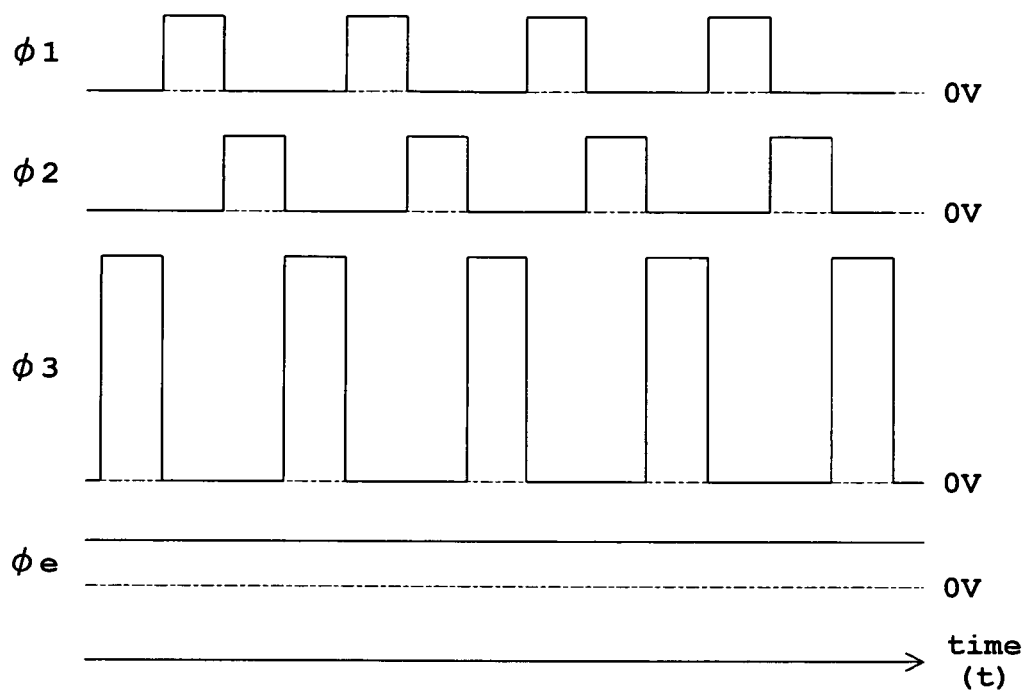
[FIG. 3]
Graph showing variations with time of driver voltages applied to a charge multiplier in the image pickup apparatus in Embodiment 1.
Figure 4:
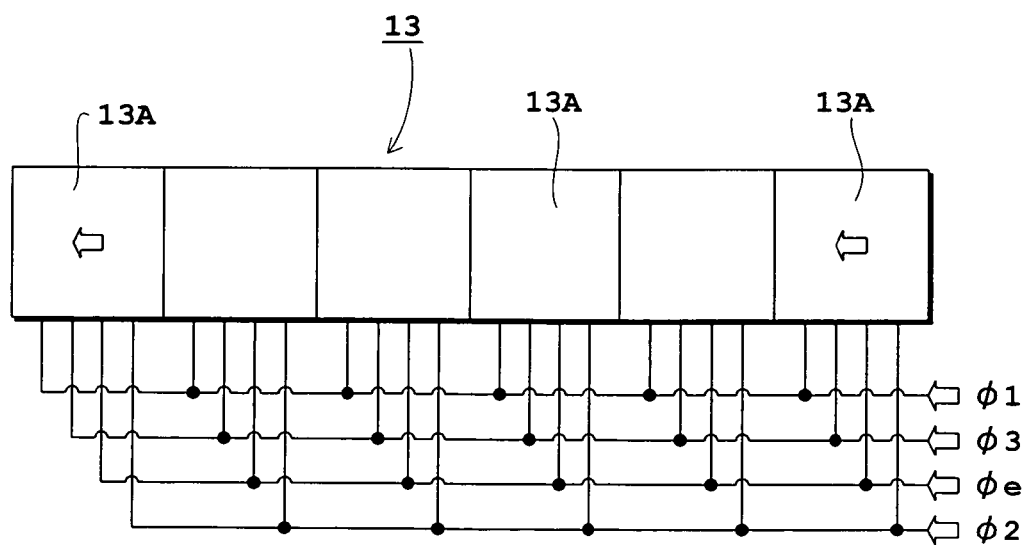
[FIG. 4]
Partial block diagram showing situations of driver voltage application to each multiplying register of the charge multiplier in the image pickup apparatus in Embodiment 1.

Driver voltages are applied to each multiplying register of the charge multiplying unit 13 from a charge multiplication voltage applying mechanism 3B of the image sensor driver 3. The charge multiplication voltage applying mechanism 3B outputs, as shown in FIG. 3, driver voltages $\phi1$-$\phi3$ with voltage values changing with time in form of pulses, a driver voltage $\phi e$ of constant voltage with a voltage value not changing with time. Driver voltages $\phi1$-$\phi3$ and $\phi e$ are applied to each multiplying register 13A as shown in FIG. 4. With the variations of driver voltages $\phi1$-$\phi3$ and $\phi e$ applied to the multiplying registers 13A, the signal charges are multiplied gradually while being transferred between the multiplying registers 13A toward the charge-to-voltage converter 12. In Embodiment 1, driver voltages $\phi1$ and $\phi2$ which serve mainly to transfer the signal charges are about 10V in voltage value, and driver voltage $\phi3$ which serves mainly to multiply the signal charges is about 40V in voltage value.

Figure 5:
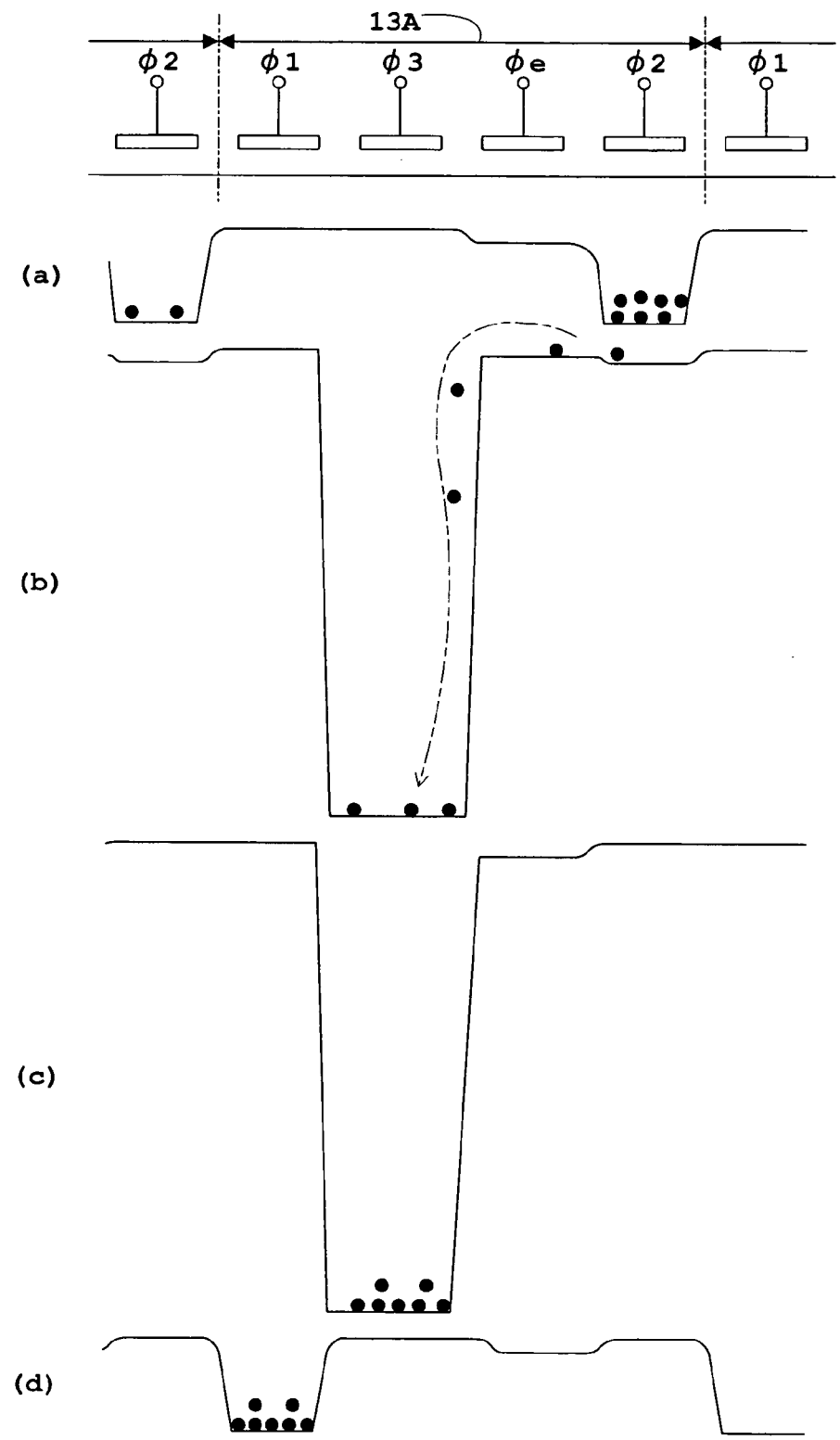
[FIG. 5]
Schematic view showing potential variations in elements of the multiplying register accompanying the application of the driver voltages to the charge multiplier of the image pickup apparatus in Embodiment 1.

To describe this more concretely by looking at one multiplying register 13A, as schematically shown in FIGS. 5 (*a*)-5 (*d*), variations take place within each element of the multiplying register 13A with variations of driver voltages $\phi1$-$\phi3$. Particularly when driver voltage $\phi3$ is applied, a high electric field region for electric charge multiplication is generated in an element of the register 13A as shown in FIG. 5 (*c*). As a result, when the signal charges pass through the high electric field region, an impact ionization phenomenon takes place, to suppress an increase of noise and multiply the signal charges, thereby to improve detection sensitivity for the object image.

Further, the solid-state image pickup device incorporated in the image pickup apparatus in Embodiment 1 has a characteristic construction including an image signal temperature variation suppressing unit 14 that electrically controls the charge multiplication gain of the charge multiplying unit 13 in response to variations in the sensor temperature of CCD image sensor 1, to suppress variations in the signal strength of the image signals caused by the variations in the sensor temperature of CCD image sensor 1. Further, as shown in FIG. 1, the image pickup apparatus in Embodiment 1 includes a temperature sensor 15 rigidly attached to the CCD image sensor itself for detecting the sensor temperature of CCD image sensor 1. The image signal temperature variation suppressing unit 14 is operated in response to the sensor temperature of CCD image sensor 1 detected by the temperature sensor 15. The temperature sensor 15 may comprise a thermistor, for example. However, the temperature sensor 15 is not limited to a particular type of temperature sensor. The image signal temperature variation suppressing unit 14 corresponds to the image signal temperature variation suppressing device in this invention.

That is, with the multiplying registers 13A of the charge multiplying unit 13, when the voltage value of driver voltage $\phi3$ applied changes, the field strength of the high electric field regions for electric charge multiplication will change to change the multiplication gain of the signal charges. In Embodiment 1, therefore, this change is used, and the image signal temperature variation suppressing unit 14 electrically controls the charge multiplication gain of the charge multiplying unit 13 by changing the voltage value of driver voltage $\phi3$ applied to the multiplying registers 13A in response to variations in the sensor temperature of CCD image sensor 1.

Figure 6:
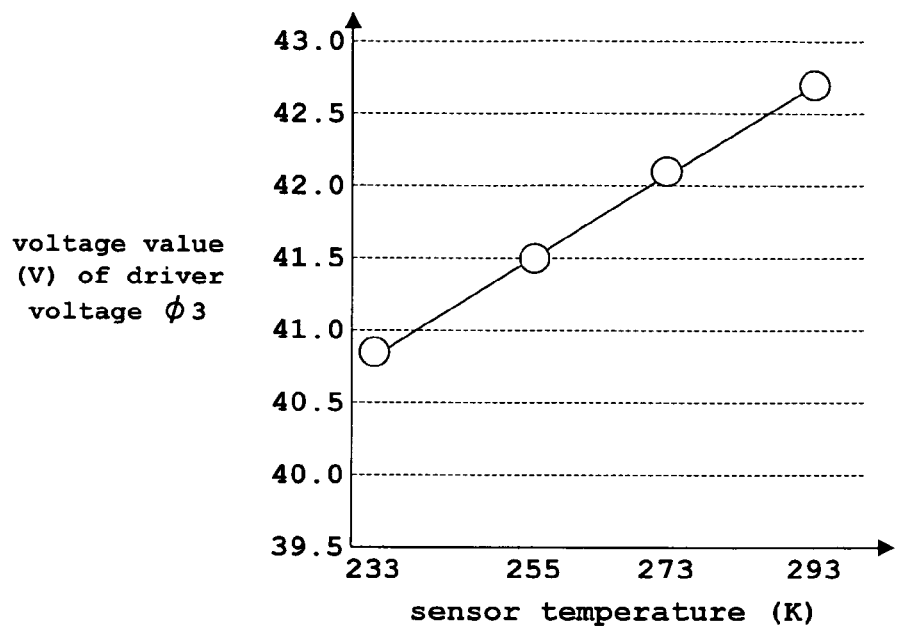
[FIG. 6]
Graph showing a correspondence relationship between sensor temperature of a CCD image sensor and voltage value of the driver voltage in the image pickup apparatus in Embodiment 1.

More particularly, based on a correspondence relationship between sensor temperature (K) of CCD image sensor 1 and voltage value (volt) of driver voltage $\phi3$ shown in FIG. 6, the image signal temperature variation suppressing unit 14 changes the voltage value of driver voltage $\phi3$ applied to the multiplying registers 13A, to prevent variations of the charge multiplication gain of the electric charge multiplying unit 13 caused by the variations in the sensor temperature of CCD image sensor 1. The image signal temperature variation suppressing unit 14 may change the voltage value of driver voltage $\phi3$ in either an analog circuit mode or a digital circuit mode.

Further, the sensor temperature of CCD image sensor 1 and the charge multiplication gain of the charge multiplying unit 13 are in an inversely proportional relationship. Thus, when the sensor temperature of CCD image sensor 1 becomes high, the voltage value of driver voltage $\phi3$ is raised to strengthen the high electric field regions for electric charge multiplication, thereby to inhibit a decrease of the electric charge multiplication gain due to the rise of the sensor temperature. Conversely, when the sensor temperature of CCD image sensor 1 becomes low, the voltage value of driver voltage $\phi3$ is lowered to weaken the high electric field regions for electric charge multiplication, thereby to inhibit an increase of the electric charge multiplication gain due to the lowering of the sensor temperature.

In Embodiment 1, as described above, the image signal temperature variation suppressing unit 14 changes the voltage value of the driver voltage applied to the multiplying registers 13A, in response to variations in the sensor temperature of CCD image sensor 1. Thus, the charge multiplication gain of the charge multiplying unit 13 is electrically controlled to suppress variations in the signal strength of the image signals due to the variations in the sensor temperature of CCD image sensor 1. As a result, without relying on thermal control with which it is very difficult to realize high precision control, variations in the signal strength of the image signals due to the variations in the sensor temperature of CCD image sensor 1 are suppressed by controlling the charge multiplication gain of the charge multiplying unit 13 based on the electric control, with which it is very easy to realize high precision control, performed by the image signal temperature variation suppressing unit 14 in response to the variations in the sensor temperature of CCD image sensor 1.

Therefore, with the image pickup apparatus and solid-state image pickup device in Embodiment 1, variations in the signal strength of the image signals due to the variations in the sensor temperature of CCD image sensor 1 are suppressed easily.

In Embodiment 1, the image signal temperature variation suppressing unit 14 changes the voltage value of driver voltage φ3 applied to the multiplying registers 13A in response to variations in the sensor temperature of CCD image sensor 1, thereby to perform an electric control of the charge multiplication gain of the charge multiplying unit 13. Thus, the charge multiplication gain of the charge multiplying unit 13 is controlled very easily based on the electric control carried out by the image signal temperature variation suppressing unit 14.

Since the charge multiplying unit 13 is arranged separately in Embodiment 1, the charge multiplying unit 13 may be arranged without changing the constructions of the other portions.

Further, in Embodiment 1, the sensor temperature of CCD image sensor 1 is detected properly by the temperature sensor 15 attached to the CCD image sensor itself. Thus, variations in the signal strength of the image signals due to the variations in the sensor temperature of CCD image sensor 1 are suppressed properly.

Figure 7:
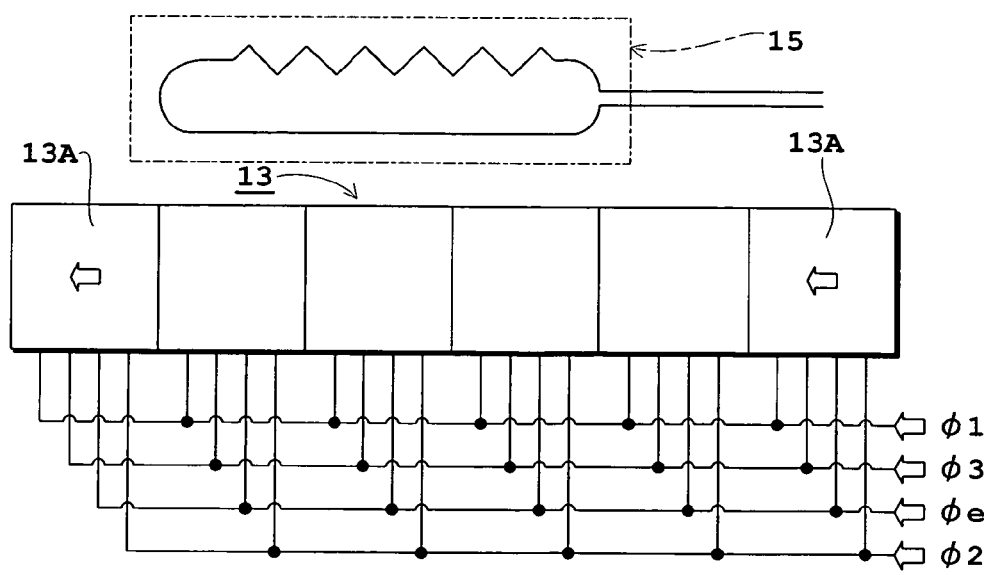
[FIG. 7]
Partial block diagram showing a modified arrangement of a temperature sensor in the image pickup apparatus in Embodiment 1.

The temperature sensor 15 for detecting the sensor temperature of CCD image sensor 1 may be installed adjacent the charge multiplying unit 13 as shown in FIG. 7. As the temperature sensor installed beside the charge multiplying unit 13 as shown in FIG. 7, a temperature detector using metal thin wires such as of copper or aluminum, for example, is used. In this case, the temperature adjacent the charge multiplying unit 13 is fully reflected in the sensor temperature of CCD image sensor 1 detected by the temperature sensor. Consequently, variations in the signal strength of the image signals accompanying temperature changes adjacent the charge multiplying unit 13 are fully suppressed.

Embodiment 2

Figure 8:
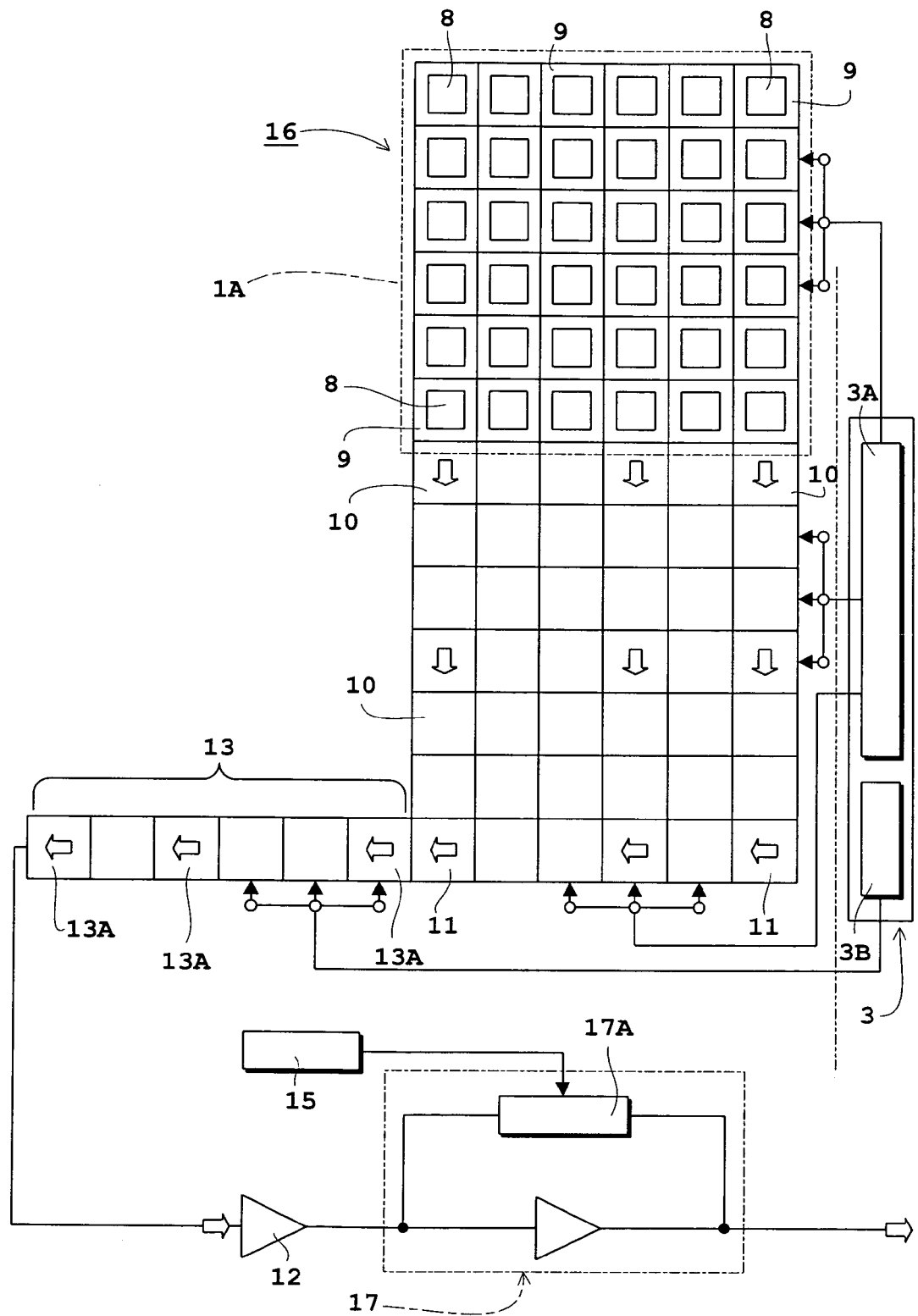
[FIG. 8]
Detailed block diagram chiefly showing a construction of a solid-state image pickup apparatus included in an image pickup apparatus in Embodiment 2.

Next, an image pickup apparatus in Embodiment 2 having another example of solid-state image pickup device of this invention incorporated therein will be described with reference to the drawing. FIG. 8 is a block diagram chiefly showing a solid-state image pickup device included in the image pickup apparatus in Embodiment 2. The image pickup apparatus in Embodiment 2 includes, instead of the image signal temperature variation suppressing unit 14 in Embodiment 1, an image signal temperature variation suppressing unit 17 that electrically adjusts the signal strength of the image signals per se in response to variations in the sensor temperature of a solid-state image sensor 16, to suppress the variations in signal strength of the image signals due to the variations in the sensor temperature of solid-state image sensor 16. The other features are substantially the same as those of Embodiment 1. The common features will not be described, but only the differences will be described. The CCD image sensor 16 corresponds to the solid-state image sensor in this invention. The image signal temperature variation suppressing unit 17 corresponds to the image signal temperature variation suppressing device in this invention.

In the solid state image pickup device of the image pickup apparatus in Embodiment 2, the image signal temperature variation suppressing unit 17, which has an amplification factor variable type amplifying function, is connected in series to the output side of the charge-to-voltage converter 12 of CCD image sensor 16, instead of changing the charge multiplication gain of the charge multiplying unit 13. The amplification factor of the amplifying function of the image signal temperature variation suppressing unit 17 is adjusted in response to the variations in the sensor temperature of CCD image sensor 16, to vary electrically the signal strength of the image signals per se, thereby to suppress the variations in the signal strength of the image signals due to the variations in the sensor temperature of CCD image sensor 16.

The sensor temperature of CCD image sensor 16 and the output voltage of charge-to-voltage converter 12 are in an inversely proportional relationship. When the sensor temperature of CCD image sensor 16 becomes high, the output voltage of charge-to-voltage converter 12 will decrease. Thus, the amplification factor of the amplifying function of the image signal temperature variation suppressing unit 17 is raised to increase the output voltage of the charge-to-voltage converter 12, thereby to inhibit the decrease of the output voltage of the charge-to-voltage converter 12 due to the rise of the sensor temperature. Conversely, when the sensor temperature of CCD image sensor 1 becomes low, the output voltage of the charge-to-voltage converter 12 will increase. Thus, the amplification factor of the amplifying function of the image signal temperature variation suppressing unit 17 is lowered to decrease the output voltage of the charge-to-voltage converter 12, thereby to inhibit the increase of the output voltage of the charge-to-voltage converter 12 due to the lowering of the sensor temperature.

The image signal temperature variation suppressing unit 17 has a resistance control type resistance element (e.g. transistor element) 17A as a feedback resister with a resistance variable by an external signal (signal relating to a temperature result of the temperature sensor 15), for example. By applying the signal relating to the temperature result of the temperature sensor 15 to the resistance control type resistance element (e.g. transistor element) 17A, the resistance of the resistance control type resistance element 17A is varied to vary the amplification factor of the amplifying function of the image signal temperature variation suppressing unit 17.

In Embodiment 2, as described above, the image signal temperature variation suppressing unit 17 varies the image signals in response to variations in the sensor temperature of CCD image sensor 16. Thus, the signal strength of the image signals per se is electrically adjusted to suppress variations in the signal strength of the image signals due to the variations in the sensor temperature of CCD image sensor 16. As a result, without relying on thermal control with which it is very difficult to realize high precision control, variations in the signal strength of the image signals due to the variations in the sensor temperature of CCD image sensor 16 are suppressed by controlling the signal strength of the image signals based on the electric adjustment, with which it is very easy to realize high precision control, performed by the image signal temperature variation suppressing unit 17 in response to the variations in the sensor temperature of CCD image sensor 16.

Therefore, with the image pickup apparatus and solid-state image pickup device in Embodiment 2, variations in the signal strength of the image signals due to the variations in the sensor temperature of CCD image sensor 16 are suppressed easily.

Embodiment 3

Figure 9:
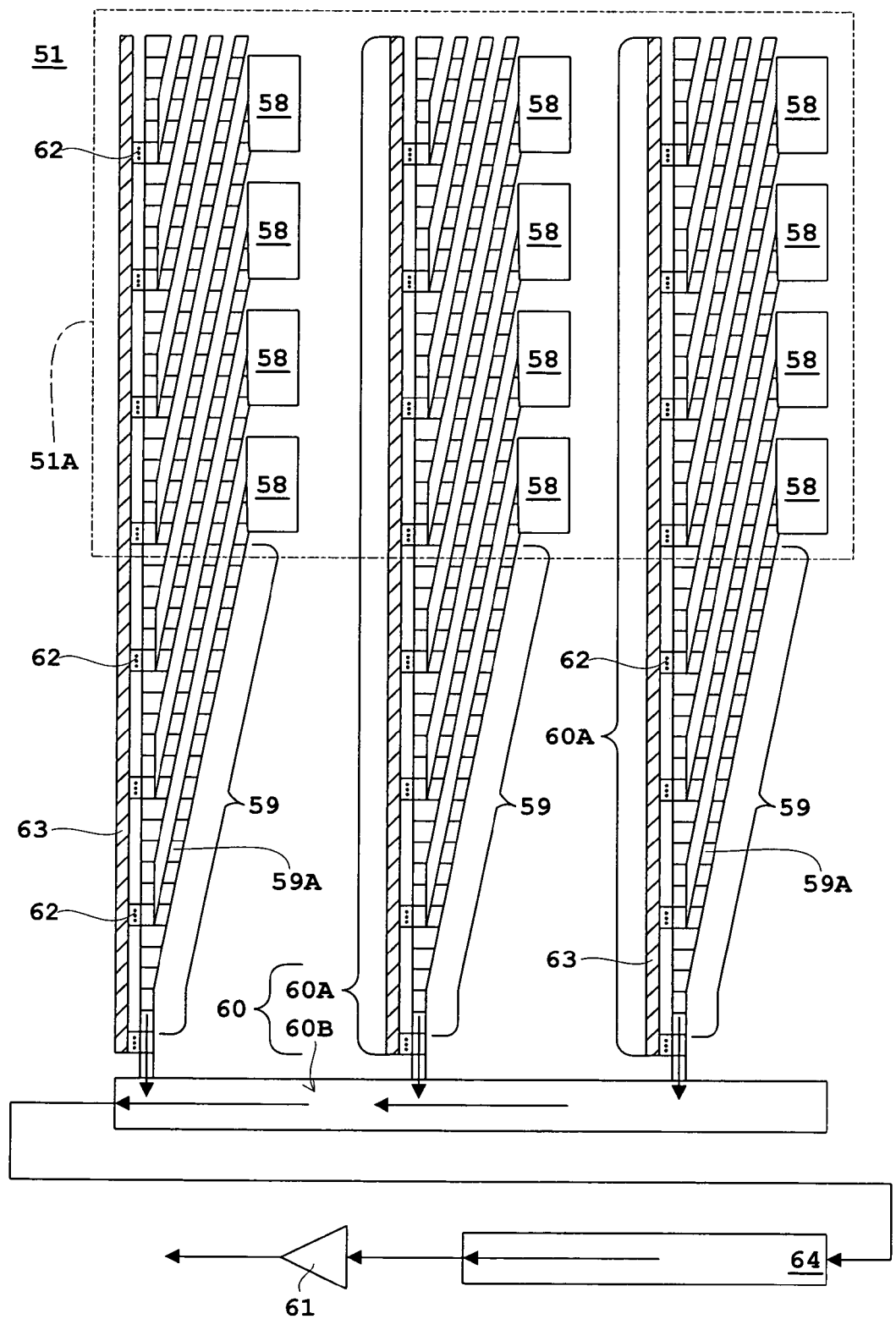
[FIG. 9]
Block diagram showing a principal portion of a high-speed image sensor in Embodiment 3.
Figure 10:
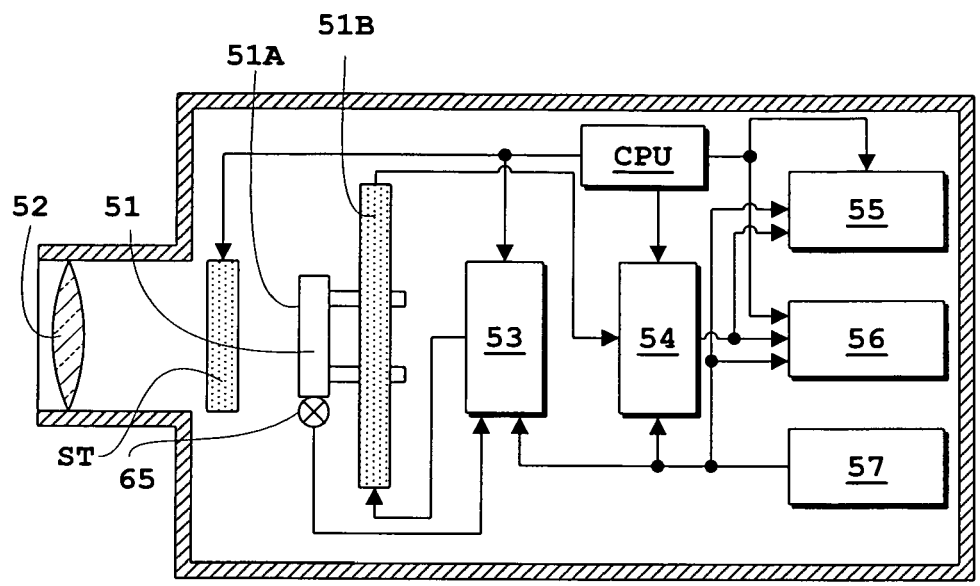
[FIG. 10]
Block diagram showing a principal portion of a high-speed image pickup apparatus having, incorporated therein, the high-speed image sensor in Embodiment 3.

Embodiment 3 of a high-speed image sensor according to this invention will be described with reference to the drawings. FIG. 9 is a block diagram showing a principal portion of the high-speed image sensor in Embodiment 3. FIG. 10 is a block diagram showing portion of a high-speed image pickup apparatus having, incorporated therein, the high-speed image sensor in Embodiment 3.

The high-speed image pickup apparatus is Embodiment 3 is substantially the same as the image pickup apparatus in Embodiment 1 (see FIG. 1), except that this is used as an image pickup apparatus for high-speed imaging. In order to distinguish Embodiment 3 from Embodiment 1, the image sensor for high-speed imaging (high-speed image sensor) is referenced "51", the optical lens 2 is referenced "52", the image sensor driver 3 is referenced "53", the image signal processor 4 is referenced "54", the image memory is referenced "55", the image display is referenced "56", and the power source is referenced "57". The image sensor in Embodiment 3 is used as high-speed image sensor, and has a construction shown in FIG. 9, as distinct from the construction of the image sensor in Embodiment 1 (see FIG. 2).

The high-speed image pickup apparatus of FIG. 10 includes the high-speed image sensor 51 which can detect optical images of an object and output image signals (video signals) thereof even in high-speed photography exceeding 10,000 frames per second, and the same optical lens 52, image sensor driver 53, image signal processor 54, image memory 55, image display 56 and power source unit 57 as in Embodiment 1. In addition, a shutter ST and a photography controller CPU are provided. With the shutter ST disposed in between, the optical lens 52 forms an optical image of the object on a plane of projection 51A of the high-speed image sensor 5. The photography controller CPU performs an overall control of the entire apparatus for smooth progress of photography.

High-speed photography performed by the high-speed image pickup apparatus in FIG. 10 follows the same procedure as the photography by the image pickup apparatus in Embodiment 1 shown in FIG. 1, and its operation will not be described again. The shutter ST is opened during a photographic operation.

The shutter ST disposed between the high-speed imaging 51 and optical lens 52 in FIG. 10 is opened only during periods for detecting and the taking in photo images, and is closed during other periods to avoid an overflow of detected electric charges. The shutter ST may be a mechanical shuttering mechanism or electronic formula shuttering mechanism. Opening and closing of the shutter ST are controlled by the photography controller CPU.

The high-speed image sensor 51, as shown in FIG. 9, includes numerous photoelectric converters 58 such as photodiodes arranged in a two-dimensional array on the plane of projection 51A of the optical image of the object, numerous signal charge storage units 59, signal charge readout units 60 and a charge-to-voltage converter 61. The signal charge storage units 59 are provided for the photoelectric converters 58, respectively. Signal charges for a plurality of frames detected through photoelectric conversion by the respective photoelectric converters 58 are taken in, frame by frame, and successively stored, frame by frame, in the respective signal charge storage units 59 (CCD cells 59A). The signal charge readout units 60 transfer and read the signal charges as matched with the frames from the signal charge storage units 59. The charge-to-voltage converter 61 converts the signal charges fed via the signal charge readout units 60 into voltage signals for output as image signals. FIG. 9 shows only part of the photoelectric converters 58 and signal charge storage units 59. In reality, numerous photoelectric converters 58 and signal charge storage units 59 are arranged both vertically and horizontally.

Figure 11:
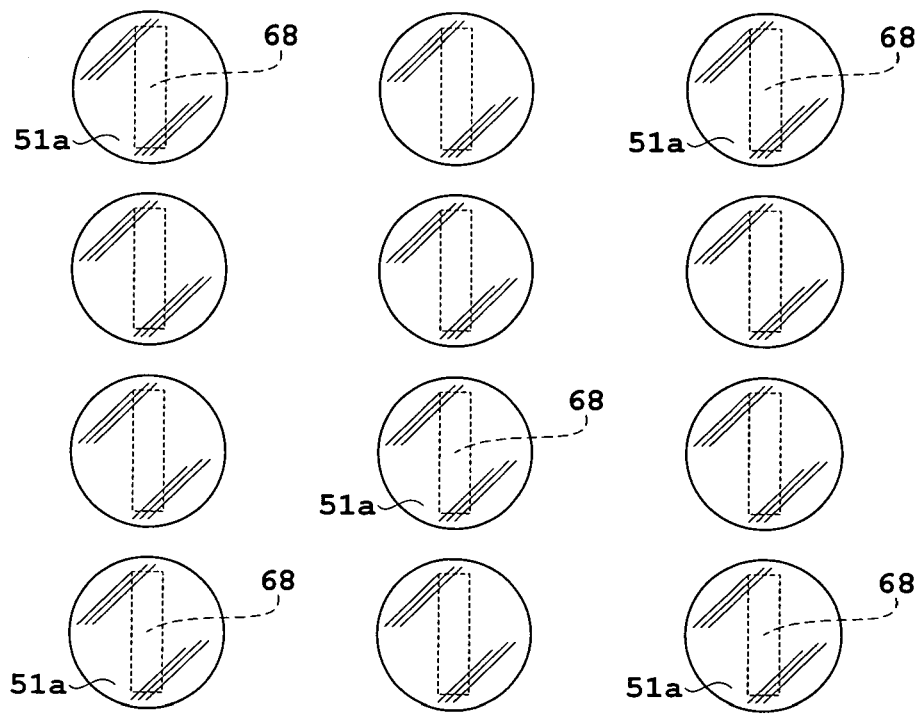
[FIG. 11]
Plan view showing an arrangement of micro lenses provided on the front of a photoelectric converter of the high-speed image sensor in Embodiment 3.

As shown in FIG. 11, the high-speed image sensor 51 in Embodiment 3 has micro lenses 51a arranged on the front of the photoelectric converters 58 for condensing light to be detected. As a result, the light to be detected is condensed on a light-receiving surface of each photoelectric converter 58 by the micro lens 51a. The micro lenses 51a increase the quantity of light incident on the light-receiving surfaces of photoelectric converters 58, thereby correspondingly improving detection sensitivity for the optical image of the object.

As shown in FIG. 9, the two-dimensional array arrangement of the photoelectric converters 58 is a square matrix, and therefore the high-speed image sensor 51 has detecting pixels also in a two-dimensional arrangement of square matrix, arranged regularly in straight rows and columns. The photoelectric converters 58 are the electrodeless type having no transfer electrodes on the light-receiving surfaces. Thus, there is no need for a step of additionally forming transfer electrodes on the light-receiving surfaces of photoelectric converters 58. It is possible to prevent a lowering of detection sensitivity for light of particular wavelength due to optical absorption action of the transfer electrodes.

As shown in FIG. 9, the signal charge storage unit 59 is a one-dimensional CCD cell array with 24 CCD cells 59A connected in series, in which the signal charges are transferred to immediately downstream CCD cells each time one frame is taken in. Thus, the signal charge storage units 59 have a simple construction. The transfer of the signal charges between the CCD cells accompanying the frame acquiring action is carried out by transfer electrodes arranged in upper positions (not shown) and by a frame acquiring transfer signal (driving pulse) outputted from the image sensor driver 53.

Further, the CCD cells 59A in the one-dimensional CCD cell array forming the signal charge storage unit 59 are arranged in a direction oblique to the direction of arrangement of the photoelectric converters 58. An increase in the number of CCD cells 59A to enlarge the length of the one-dimensional CCD cell array will not run against the photoelectric converters 58 vertically and horizontally close thereto. Thus, it is possible to increase the number of CCD cells 59A in the one-dimensional CCD cell array as the signal charge storage unit 59, thereby to increase the number of signal charges storable in the signal charge storage unit 59 and to increase the number of images to be photographed continuously.

In the case of the high-speed image sensor 51, during a photographic operation, whenever one frame is taken in, electrode gates (not shown) provided between the photoelectric converters 58 and signal charge storage units 59 open, whereby signal charges are fed from the photoelectric converters 58 to the first, 24th CCD cells 59A of the respective signal charge storage units 59 to be stored therein. Subsequently, whenever one frame is taken in, new signal charges are fed to the 24th CCD cells 59A and, in synchronism therewith, the signal charges stored previously are transferred forward to next CCD cells 59A all at once. This operation is repeated. It is thus possible to accumulate signal charges for 24 frames, which correspond in number to the CCD cells 59A, in the signal charge storage units 59 at a time.

On the one hand, the high-speed image sensor 51, as shown in FIG. 9, includes continuous overwrite drain gates 62 arranged at exit ends of the respective signal charge storage units 59, and continuous overwrite drains 63 for discharging signal charges sent from the continuous overwrite drains 62. With the continuous overwrite drain gates 62 opened, signal charges fed to and stored in the first CCD cells 59A of the signal charge storage units 59 are discharged through the continuous overwrite drains 63 when a next frame is acquired. Thus, a continuous overwrite operation can be carried out by keeping the continuous overwrite drain gates 62 open.

On the other hand, the signal charge readout units 60 of the high-speed image sensor 51, as shown in FIG. 9, include vertical readout CCD cell arrays 60A having five, first to fifth CCD cells 59A of the signal charge storage units 59 connected vertically, and a horizontal readout CCD cell array 60B to which the ends of the CCD cell arrays 60A are connected.

When the signal charge readout units 60 read the signal charges, the shutter ST and continuous overwrite drain gates 62 are closed, and the signal charges stored in the lowermost signal charge storage units 59 are first read through the vertical readout CCD cell arrays 60A and from the horizontal readout CCD cell array 60B. Then, the signal charges stored in the signal charge storage units 59 immediately above are read similarly. This operation is repeated to read the signal charges stored in all the signal charge storage units 59.

The transfer of the signal charges between the CCD cells of the signal charge readout units 60 accompanying the signal charge readout is carried out by the transfer electrodes arranged in upper positions (not shown) and by a signal readout transfer signal (driving pulse) outputted from the image sensor driver 53. The signal charge readout by the signal charge readout units 60 is performed while maintaining matching with the frames acquired. The matching between the signal charges read and the frames acquired can be effected by setting the signal readout transfer signal to a one-to-one relationship with the order of the CCD cells 59A of the signal charge storage units 59.

It is not necessary to read continuously all of the 24 signal charges stored in the signal charge storage units 59. For example, the 24 signal charges may be read in groups of five each. Then, the horizontal readout CCD cell array 60B may have a reduced number of CCD cells.

With the high-speed image sensor 51, as described above, the signal charges corresponding to photo frames of optical images of an object are transferred and read from the signal charge readout units 60 as matched with the frames acquired. Thus, the image signal processor 4 disposed downstream can reproduce high-speed photo images for each image from the signal charges read.

Further, as shown in FIG. 9, the high-speed image sensor 51, as does the image sensor 1 in Embodiment 1, includes a charge multiplying unit 64 disposed between the signal charge readout units 60 and charge-to-voltage converter 61 for multiplying signal charges based on an impact ionization phenomenon caused by the signal charges passing through high electric field regions. The charge multiplying unit 64 has the same construction as the charge multiplying unit 13 in Embodiment 1 shown in FIG. 4, and will not be described. Multiplying registers 64A in FIG. 12 described hereinafter correspond to the multiplying registers 13A shown in FIG. 4.

Variations with time of driver voltages $\phi 1$-$\phi 3$ and $\phi e$ applied to the charge multiplying unit 64, and potential variations in the elements accompanying the driver voltage application to the multiplying registers 64A of the charge multiplying unit 64, are the same as in FIG. 3 and FIG. 5 of Embodiment 1, and will not be described.

Next, a photographing operation of the high-speed image pickup apparatus having the composition described in detail above will particularly be described. The high-speed image pickup apparatus of FIG. 10 is constructed for selectively performing high-speed photography exceeding 10,000 frames per second, and low-speed photography (e.g. 30 frames per second) slower than the high-speed photography. Usually, for example, the continuous overwrite drain gates 62 are opened to perform overwrite photography at low speed. The continuous overwrite drain gates 62 are closed as necessary to perform non-overwrite photography at high speed.

Usually, whenever signal charges for each frame are taken from the photoelectric converters 58 into the signal charge storage units 59 at the low speed of 30 frames per second, the signal charges are transferred between and stored in the 24 CCD cells 59A of each signal storage unit 59 at the low speed of 30 frames per second. After the signal charges are stored also in the first CCD cells 59A, whenever next frames are acquired, the signal charges stored in the first CCD cells 59A pass through the continuous overwrite drain gates 62 to be discharged from the continuous overwrite drains 63, to continue the continuous overwriting at the low speed.

After being switched to the high-speed photography upon appearance of an object for high-speed photography (e.g. occurrence of an explosion phenomenon), whenever signal charges for each frame are taken from the photoelectric converters 58 into the signal charge storage units 59 at the high speed of 10,000 frames per second, the signal charges are transferred between and stored in the 24 CCD cells 59A of each signal storage unit 59 at the high speed of 10,000 frames per second. The continuous overwrite drain gates 62 are opened while the signal charges accumulated during the low-speed photography remain in the signal charge storage units 59. When all the signal charges accumulated in the low-speed photography have been discharged from the continuous overwriting drain gates 62, the continuous overwrite drain gates 62 are closed immediately to stop the high-speed photography. As a result, the 24 CCD cells 59A of each signal charge storage unit 59 have, stored therein, only the signal charges fed from the photoelectric converters unit 58 during the high-speed photography. In other words, the high-speed photography is finished when an image acquiring operation has been repeated 24 times after switching to the high-speed photography. The 24 CCD cells 59A have, accumulated therein, signal charges for the high-speed photography images for 24 frames.

Further, the shutter ST is closed upon termination of photography, the signal charges accumulated in the signal charge storage units 59 are successively read by the signal charge readout units 60, then multiplied by the charge multiplying unit 64, converted into voltage signals by the charge-to-voltage converter 61, and outputted as image signals to the image signal processor 54. The image signal processor 54 processes the image signals, and edits and acquire high-speed photo images of 24 frames. The acquired high-speed photo images are stored in the image memory 55 and displayed on the image display 56 as necessary.

In the case of the high-speed image sensor 51 in Embodiment 3, as described above, each photoelectric converter 58 has a signal charge storage unit 59 attached thereto for successively taking in, frame by frame, and storing for a plurality of frames, signal charges corresponding to photographic frames of optical images of the object fed from the photoelectric converter 58 which detects the optical images of the object through photoelectric conversion. Thus, signal charges corresponding to photographic frames of the optical images of the object can be detected and stored at high speed in amounts corresponding to a plurality of photographic frames. The signal charge readout units 60 transfer and read the signal charges from the signal charge storage units 59 as matched with the frames, whereby a high-speed photographic image for each frame can be reproduced from the signal charges read.

Further, in the case of the high-speed image sensor 51 in Embodiment 3, after the signal charges corresponding to the photographic frames of optical images of the object are read by the signal charge readout units 60, the charge multiplying unit 64 multiplies the signal charges, without an increase of noise, based on an impact ionization phenomenon caused by the signal charges passing through high electric field regions. Thus, the area of the light-receiving surfaces of photoelectric converters 8 can be diminished by an amount corresponding to the multiplication of the signal charges by the charge multiplying unit 64.

Therefore, according to the high-speed image sensor 51 in Embodiment 3, the area of the light-receiving surfaces of photoelectric converters 58 which carry out photoelectric conversion of the optical image of the object can be reduced. The reduction in the area of the light-receiving surfaces of photoelectric converters 58 diminishes the photoelectric converters 58 to realize high density of the photoelectric converter 58. Since the signal charges can be fetched quickly, photographing speed can also be accelerated.

Figure 12:
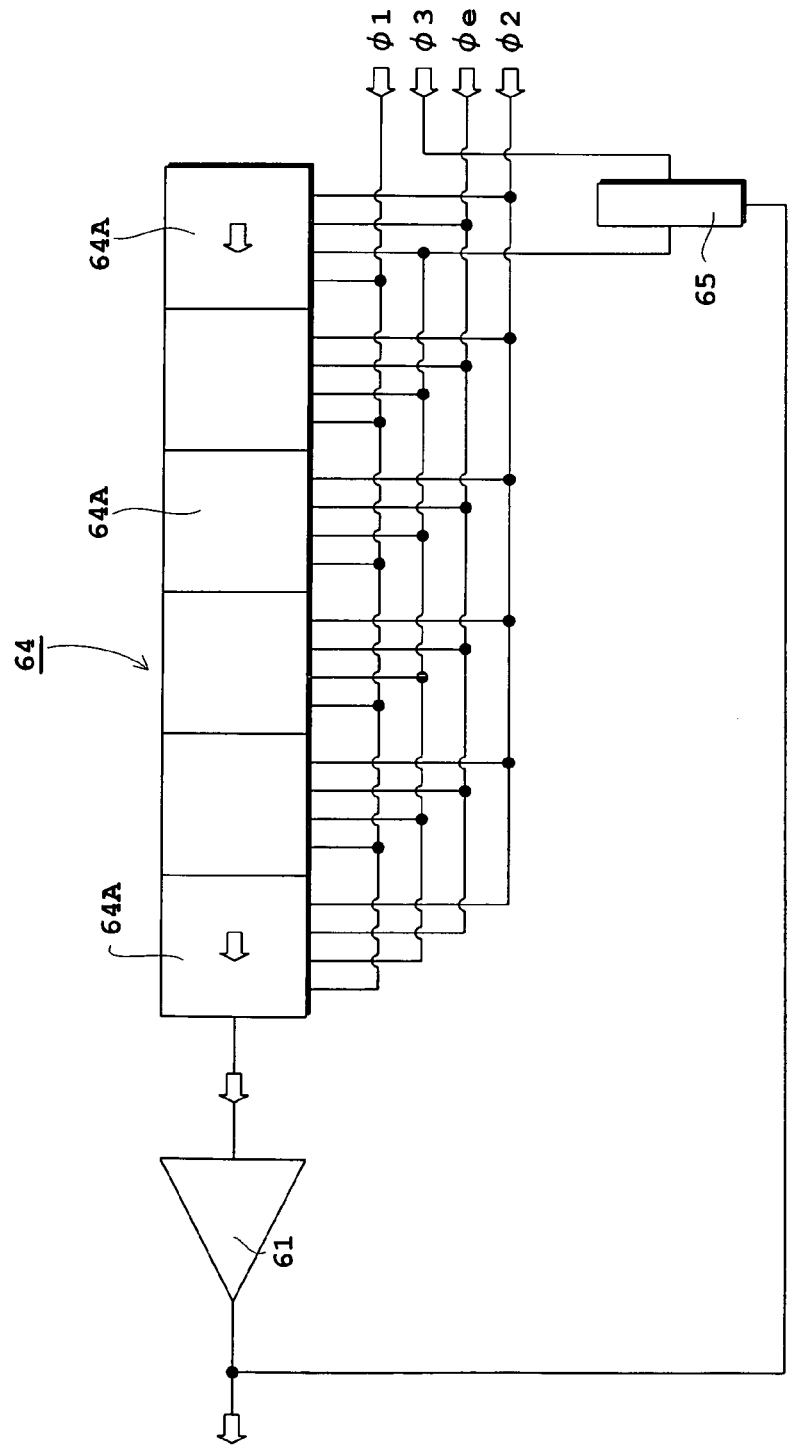
[FIG. 12]
Partial block diagram showing a modified high-speed image pickup apparatus having, incorporated therein, the high-speed image sensor in Embodiment 3.

The high-speed image pickup apparatus in FIG. 10 may be constructed to perform controls so that the image signals outputted from the high-speed image sensor 51 may have an appropriate range of voltage values. As shown in FIG. 12, for example, an automatic gain control unit 65 may be provided for controlling the voltage value of driver voltage $\phi 3$ applied to the multiplying registers 64A, in response to an output signal of the charge-to-voltage converter 61, thereby producing image signals having voltage values in an appropriate range. In this case, the automatic gain control unit 65 may be built in the high-speed image sensor 61.

Figure 13:
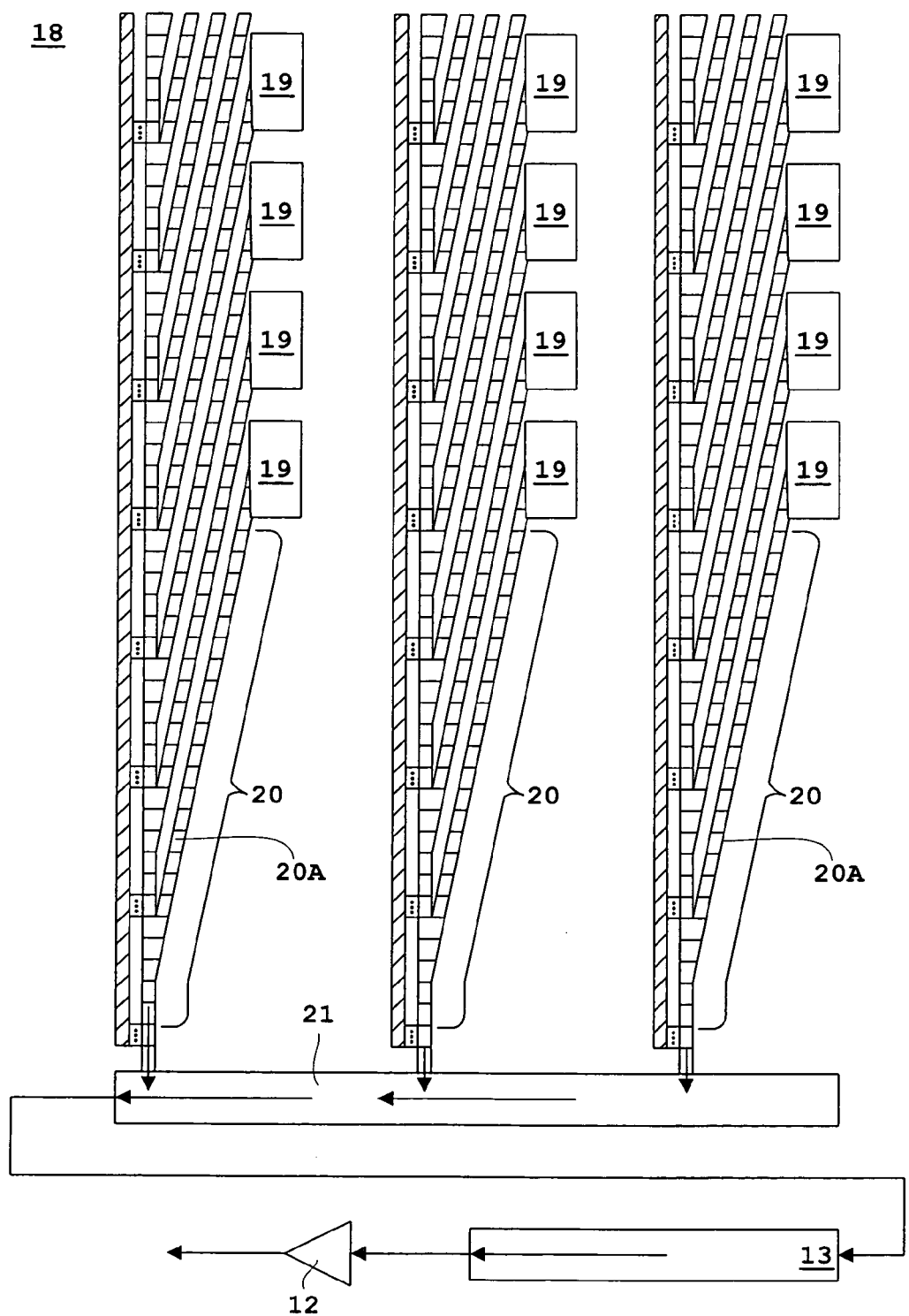
[FIG. 13]
Block diagram showing another example of solid-state image sensor to which the invention made in order to solve problem (i) is applied.
Figure 14:
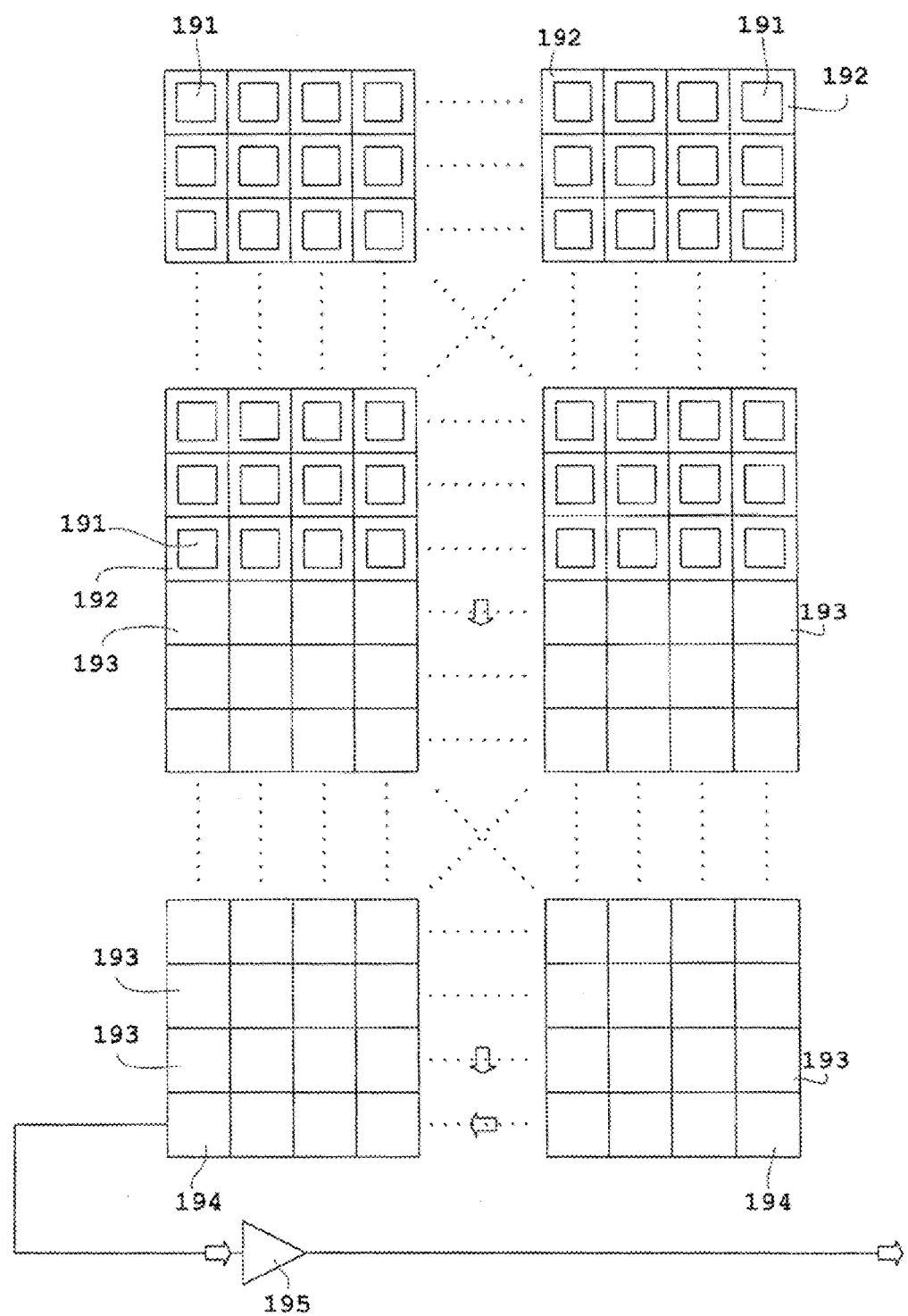
[FIG. 14]
Block diagram showing a construction of a CCD image sensor used in a conventional image pickup apparatus.
Figure 15:
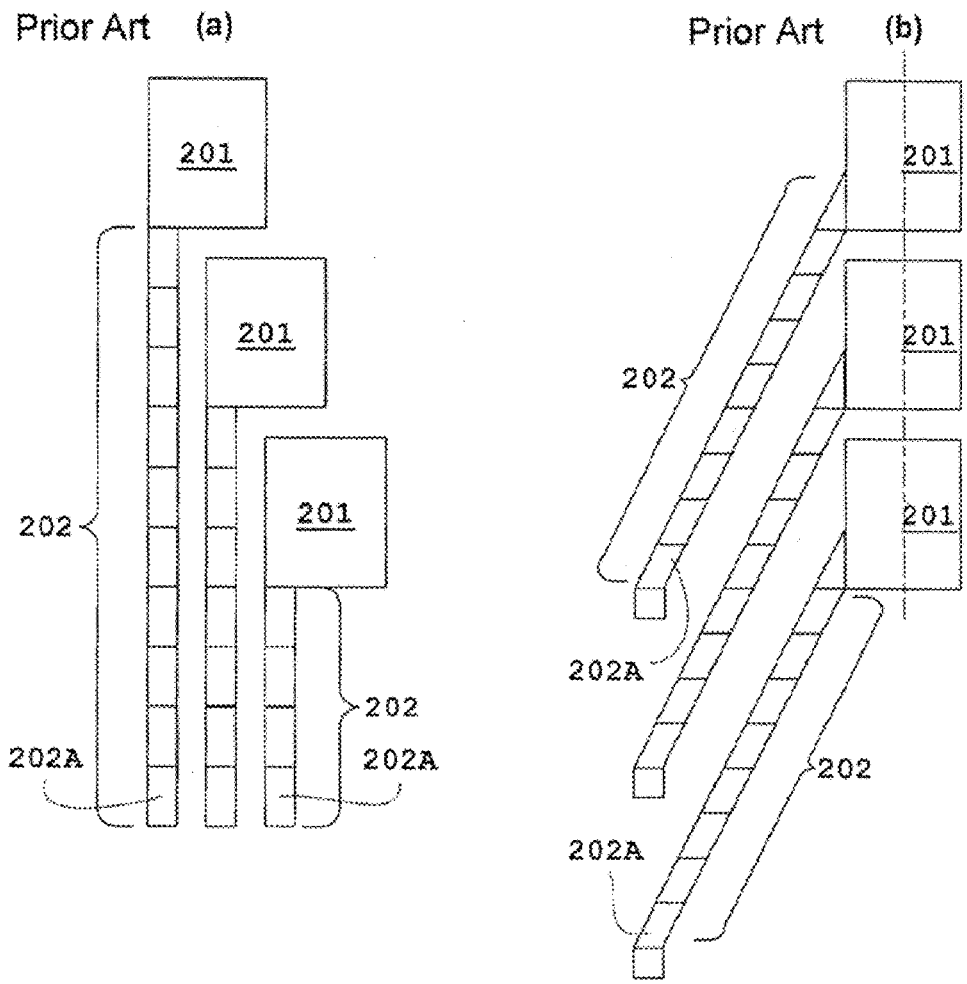
[FIG. 15]
($a$) is a block diagram showing an example of principal portion of a conventional high-speed image sensor, and ($b$) is a block diagram showing another example of principal portion of a conventional high-speed image sensor.
Figure 16:
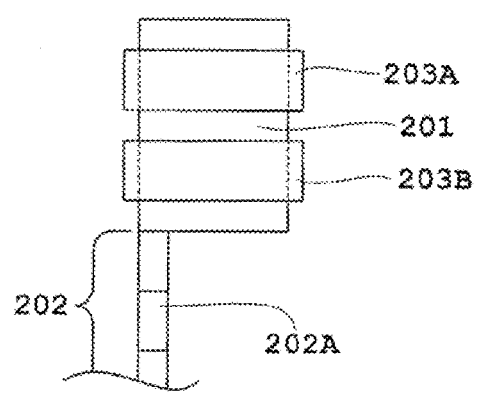
[FIG. 16]
Plan view showing transfer electrode provided on photoelectric converters of the conventional high-speed image sensor.

This invention is not limited to the foregoing embodiments, but may be modified as follows:

(1) The invention made in order to solve the problem (i) noted hereinbefore is applicable also to a CCD image sensor 18 for high-speed imaging as shown in FIG. 13. The CCD image sensor 18 includes photoelectric converters 19 each having a storage unit 20 with 24 transfer/storage CCD cells 20A connected in series. During high-speed photography, signal charges detected through photoelectric conversion by the photoelectric converters 19 at each shuttering are transferred to and stored in the CCD cells of the storage units 20 attached to the photoelectric converters 19. After the photography, the signal charges are read from the storage units 20 by output registers 21. A charge multiplying unit 13 is interposed between the output registers 21 and a charge-to-voltage converter 12 as in Embodiment 1.

This CCD image sensor 18 corresponds to the high-speed image sensor 51 in Embodiment 3 of the invention made in order to solve the problem (ii) noted hereinbefore. The photoelectric converters 19 correspond to the photoelectric converters 58 in Embodiment 3. The storage units 20 correspond to the signal charge storage units 59 in Embodiment 3. The charge-to-voltage converter 12 corresponds to the charge-to-voltage converter 61 in Embodiment 3.

As described in Embodiment 3, the CCD image sensor 18 has also an advantage of the photoelectric converters 19 being in a square arrangement, since the CCD cells of storage units 20 are connected to extend linearly and obliquely relative to a straight line linking the central lines of adjacent photoelectric converters 19.

(2) In Embodiment 1, the voltage value of driver voltage $\phi 3$ applied to the multiplying registers 13A is changed to prevent variations of the charge multiplication gain of the charge multiplying unit 13. Instead, the number of multiplying registers 13A connected in series may be changed to prevent variations of the charge multiplication gain of the entire charge multiplying unit 13. In this case also, the electric charge multiplying unit 13 may be connected commonly to storage units 20.

(3) While, in Embodiments 1 and 2, the solid-state image sensor is the CCD type, this invention is applicable also where the solid-state image sensor is the MOS type.

(4) In Embodiments 1 and 2, the charge multiplying unit 13 is provided separately and downstream of the output registers. Instead, the charge multiplying unit 13 may be integrated with the CCD cells 10 and connected commonly to the CCD cells 10.

(5) In Embodiments 1 and 2, the temperature sensor is attached to the CCD image sensor itself. However, the temperature sensor may be provided separately instead of being attached to the CCD image sensor.

(6) In Embodiment 1, the image signal temperature variation suppressing unit 14 is provided separately from the CCD image sensor 1. Instead, the image signal temperature variation suppressing unit 14 may be built in the CCD image sensor 1 as an integral part thereof. In Embodiment 2 also, the image signal temperature variation suppressing unit 17 may be provided separately from the CCD image sensor 16, or may be integrated therewith.

(7) In Embodiment 1, the image signal temperature variation suppressing unit 14 is disposed outside the image sensor driver 3. Instead, the image signal temperature variation suppressing unit 14 may be incorporated into the image sensor driver 3.

(8) In Embodiment 2, the image signal temperature variation suppressing unit 17 is added downstream of the charge-to-voltage converter 12. Instead, the image signal temperature variation suppressing unit 17 may be incorporated into the charge-to-voltage converter 12 to change the amplification factor of the charge-to-voltage converter 12, thereby to suppress variations of the signal strength of the image signals due to the variations in the sensor temperature of CCD image sensor 16.

(9) In the case of the high-speed image sensor 51 in Embodiment 3 of the invention made in order to solve the problem (ii) noted hereinbefore, each signal charge storage unit 59 has 24 CCD cells 59A. The number of CCD cells 59A is not limited to 24. The number of CCD cells 59A of each signal charge storage unit 59 may be 100, for example.

(10) In the high-speed image sensor 51 in Embodiment 3, the two-dimensional array arrangement of the photoelectric converters 58 is a square matrix. However, the two-dimensional array arrangement of the photoelectric converters 58 is not limited to the square matrix.

(11) In the high-speed image sensor 51 in Embodiment 3, a high-speed image sensor of the same construction as in Embodiment 3 except that the image sensor driver 53 is built in is mentioned as a modification.

INDUSTRIAL UTILITY

As described hereinbefore, this invention is suited to solid-state image sensors with sensor temperature changeable immediately.

The invention claimed is:

1. A solid-state image pickup apparatus for picking up images, comprising
a solid-state image sensor,
a charge multiplying device and
an image signal temperature variation suppressing device,
wherein said solid-state image sensor includes
a plurality of photoelectric conversion devices arranged in a two-dimensional array on a plane of projection of an object image,
a charge transfer device for transferring signal charges detected through photoelectric conversion by the respective photoelectric conversion devices,
a charge-to-voltage conversion device for converting the signal charges transferred from the charge transfer device into voltage signals for output as image signals, and
a temperature detecting device for detecting a sensor temperature of the solid-state image sensor,
wherein said charge multiplying device multiplies the signal charges based on an impact ionization phenomenon caused by the signal charges passing through high electric field regions, said charge multiplying device being disposed upstream of said charge-to-voltage conversion device, and said imaging signal temperature variation suppressing device controls a driver voltage of the charge multiplying device in response to variations in the sensor temperature of the solid-state image sensor detected by said temperature detecting device, to suppress variations in charge multiplication gain of the charge multiplying device due to the variations in the sensor temperature of the solid-state image sensor, or electrically adjusts conversion gain of the charge-to-voltage conversion device in response to variations in the sensor temperature of the solid-state image sensor detected by said temperature detecting device, to suppress the variations in the charge multiplication gain of the charge multiplying device due to the variations in the sensor temperature of the solid-state image sensor, and
wherein said image signal temperature variation suppressing device has a resistance control type resistance element as a feedback resister with a variable resistance, the resistance of the resistance control type resistance element being varied based on a result of the sensor temperature of the solid-state image sensor, to adjust an amplification factor of an amplifying function of the image signal temperature variation suppressing device to adjust electrically the conversion gain of the charge-to-voltage conversion device, thereby to suppress variations in the charge multiplication gain of the charge multiplication device due to the variations in the sensor temperature of the solid-state image sensor.

2. The solid-state image pickup apparatus as defined in claim 1, wherein said charge multiplying device includes a plurality of multiplying registers for successively transferring the signal charges, each multiplying register generating a high electric field region for charge multiplication in an element of the multiplying register in response to a driver voltage applied thereto, and multiplying the signal charges by passing the charges through the high electric field regions for charge multiplication when transferring the signal charges, the high electric field regions for charge multiplication having a field strength changeable with changing of a voltage value of the driver voltage applied, the charge multiplication gain of the charge multiplying device being electrically controlled by changing the voltage value of the driver voltage in response to variations in the sensor temperature of the solid-state image sensor.

3. The solid-state image pickup apparatus as defined in claim 1 or 2, wherein said solid-state image sensor and said charge multiplying device are arranged separately.

4. The solid-state image pickup apparatus as defined in claim 1 or 2, wherein said temperature detecting device is attached to the solid-state image sensor itself, the imaging signal temperature variation suppressing device being operable in response to the sensor temperature of the solid-state image sensor detected by the temperature sensor.

5. The solid-state image pickup apparatus as defined in claim 1 or 2, wherein said temperature sensor is disposed adjacent said charge multiplying device.

6. The solid-state image pickup apparatus as defined in claim 1 or 2, wherein said temperature sensor is a thermistor.

7. The solid-state image pickup apparatus as defined in claim 1 or 2, wherein said temperature sensor is a temperature detector using metal thin wires.

8. The solid-state image pickup apparatus as defined in claim 1 or 2, wherein each of said photoelectric conversion devices has a plurality of signal charge storage devices for storing the signal charges detected through photoelectric conversion by the photoelectric conversion device.

9. An image pickup apparatus having the solid-state image pickup apparatus as defined in claim 1 or 2.

* * * * *